US006995572B2

(12) United States Patent
Arndt et al.

(10) Patent No.: US 6,995,572 B2
(45) Date of Patent: Feb. 7, 2006

(54) SENSOR AND METHOD FOR DETECTING A SUPERSTRATE

(75) Inventors: G. Dickey Arndt, Houston, TX (US); James R. Carl, Houston, TX (US); Phong H. Ngo, Friensdwood, TX (US); Patrick W. Fink, Fresno, TX (US); James D. Siekierski, Houston, TX (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 974 days.

(21) Appl. No.: 09/803,613

(22) Filed: Mar. 5, 2001

(65) Prior Publication Data

US 2002/0156588 A1 Oct. 24, 2002

(51) Int. Cl.
*G01R 27/04* (2006.01)
*G01R 27/32* (2006.01)

(52) U.S. Cl. .................................................... 324/639

(58) Field of Classification Search ................ 324/639, 324/637, 76.56, 95, 643; 340/580, 962; 73/170.26
See application file for complete search history.

(56) References Cited

U.S. PATENT DOCUMENTS 4,054,255 A 10/1977 Magenheim ................ 244/134
4,470,123 A 9/1984 Magenheim et al. ....... 364/563
4,649,713 A 3/1987 Bezek ......................... 62/140
4,688,185 A 8/1987 Magenheim et al. ....... 364/563
4,766,396 A 8/1988 Taya et al. .................. 330/288
5,005,015 A 4/1991 Dehn et al. ................. 340/962
5,233,306 A * 8/1993 Misra .......................... 324/601
5,474,261 A * 12/1995 Stolarczyk et al. ...... 244/134 F
5,497,100 A 3/1996 Reiser et al. ............... 324/643
5,551,288 A 9/1996 Geraldi et al. ........... 73/170.26
5,569,850 A 10/1996 Rauckhorst, III ........ 73/170.26
5,629,485 A * 5/1997 Rose et al. ................... 73/599
5,695,155 A * 12/1997 Macdonald et al. ..... 244/134 F
5,772,153 A 6/1998 Abaunza et al. ............ 244/134
5,781,115 A 7/1998 Shea .......................... 340/580
6,407,555 B2 * 6/2002 Joshi et al. ................. 324/636

* cited by examiner

*Primary Examiner*—Anjan Deb
*Assistant Examiner*—John Teresinski
(74) *Attorney, Agent, or Firm*—Theodore U. Ro

(57) ABSTRACT

Method and apparatus are provided for determining a superstrate on or near a sensor, e.g., for detecting the presence of an ice superstrate on an airplane wing or a road. In one preferred embodiment, multiple measurement cells are disposed along a transmission line. While the present invention is operable with different types of transmission lines, construction details for a presently preferred coplanar waveguide and a microstrip waveguide are disclosed. A computer simulation is provided as part of the invention for predicting results of a simulated superstrate detector system. The measurement cells may be physically partitioned, nonphysically partitioned with software or firmware, or include a combination of different types of partitions. In one embodiment, a plurality of transmission lines are utilized wherein each transmission line includes a plurality of measurement cells. The plurality of transmission lines may be multiplexed with the signal from each transmission line being applied to the same phase detector. In one embodiment, an inverse problem method is applied to determine the superstrate dielectric for a transmission line with multiple measurement cells.

53 Claims, 10 Drawing Sheets

SENSOR AND METHOD FOR DETECTING A SUPERSTRATE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

1. Field of the Invention

The present invention relates to sensor systems and methods for detecting superstrates on or near the sensor and, more specifically, to a sensor system including transmission line sensors and methods for detecting and identifying superstrates such as, for example, coatings of ice on an airplane wing or road.

2. Description of the Prior Art

Identification of the presence, absence, and type of coating or superstrate on a suitably shaped sensor can be extremely useful. For instance, it would be highly desirable to detect the presence of ice on airplane wings, bridges, and roads with a sensor that conforms to the shape of the surface to be measured. Other applications for such a sensor include, for instance, detection of surface buildup in pipelines, detection of thin coatings, i.e., paints, oils, and the like, and proximity detection for automated machinery or robots.

Airlines have expressed a special interest in an ice detection system that meets certain requirements such as the ability to distinguish between ice and other contaminants such as antifreeze that may be on the wing. While identifying the presence or absence of ice is a major objective, one aspect of such a system should preferably include means to give accurate reading on the thickness and rate of ice buildup, if ice is present. The sensor should not influence the aerodynamics of the surface to be protected. The system should be compact. The system should be of sturdy construction, preferably with few components, and contain no parts that could work loose in service. Preferably the sensor should have a metallic surface so that ice adheres to the sensor in the same manner that it adheres to metallic wing surfaces so as to provide accurate readings.

Measuring ice buildup on airplanes is prompted by an increased concern over recent airplane crashes which were blamed on wing icing. Actual crashes are not the only concern. Each year airlines use about 10 million gallons of toxic ethylene glycol, entailing millions of dollars in material and cleanup cost. Many delays at airports result due to the time consuming de-icing process. These problems could be greatly reduced if a system were available to notify the pilot, if indeed, there is ice building up on the wing.

With respect to ice on roads and bridges, the highway departments spends millions of tax dollars each year for assuring that roadways are clear of ice and snow. Many tons of sand and salt are spread on roads that have not and will not accumulate ice. Moreover because the specific locations of iced areas are not known, the logistics and time required to spread sand and salt on all roads increases the time before the actually ice endangered roads are worked on. The introduction of an ice detector to the roadways, especially on bridges and other overpasses, could greatly reduce this waste as well as improve safety and time. The cost of the system would be quickly returned in savings. This type of application is very similar to the implementation of the sensor on wings of airplanes. It too would be required to be flush to the road and have the ability to give an accurate reading of the presence of ice buildup on the road.

As another example, Oil Companies have had a problem for many years now with superstrate buildup. As oil flows through a pipe, over time a solid residue begins to form on the inside of the pipe causing the flow of oil to become much less efficient. Eventually, the Oil Company must flush out this residue by sending a chemical through the line that liquefies the substance and returns the flow to normal. The process is quite costly. In an attempt to minimize the frequency of this process, oil companies have expressed a desire to know when a significant amount of residue has accumulated. The same type of needs may be found in refineries or other pipeline fluids.

For ice detectors, there are currently many methods being proposed for ice detection on airplane wings, including antennas, piezoelectric transducers, ultrasonic transducers, optical occlusion, and airflow sensors. With respect to sensors useful for operation in detecting ice on an airplane wing, the prior art sensors have one or more deficiencies. They may have a low sensitivity to thin layers of ice or do not conform to an airplane wing. The cost, complexity, and/or size may prohibit such use. They may not have the ability to distinguish between a variety of superstrates. Finally, the reliability may not be sufficient especially under the widely variable conditions of operation.

Some devices may measure thickness once the type of material is known. For instance, a microwave ice accretion measurement device instrument (MIAMI) developed by Ideal Research, Inc. under NASA Lewis sponsorship consists of a dielectric waveguide whose resonant frequency changes with superstrate dielectric and thickness. However, the MIAMI device does not have a metallic surface that is similar to the surface of airplane wings. This type of device or other type of device for detecting thickness of a known superstrate could be used in conjunction with one embodiment of the present invention that detects ice layers as thin as one millimeter.

The following patents disclose attempts to solve the above-discussed problems and related problems.

U.S. Pat. No. 5,551,288, issued Sep. 3, 1996 to Geraldi et al., discloses an improved ice sensor which is particularly effective in measuring and quantifying non-uniform, heterogeneous ice typically found on aircraft leading edges and top wing surfaces. In one embodiment, the ice sensor comprises a plurality of surface mounted capacitive sensors, each having a different electrode spacing. These sensors measure ice thickness by measuring the changes in capacitance of the flush electrode elements due to the presence of ice or water. Electronic guarding techniques are employed to minimize baseline and parasitic capacitances so as to decrease the noise level and thus increase the signal to noise ratio. Importantly, the use of guard electrodes for selective capacitive sensors also enables distributed capacitive measurements to be made over large or complex areas, independent of temperature or location, due to the capability of manipulating the electric field lines associated with the capacitive sensors.

U.S. Pat. No. 5,569,850, issued Oct. 29, 1996 to Richard L. Rauckhorst, III, discloses an ice detector which includes a pair of electrodes connected by a pair of leads to a control unit which measures the impedance (or other parameters) between leads to thereby sense and detect ice or other contaminants formed on top thereof. Electrodes are integrated into a patch and comprised of a top layer of conductive resin, a middle layer of conductive cloth and a bottom layer of conductive resin.

U.S. Pat. No. 5,474,261, issued Dec. 12, 1995 to Stolarczyk et al., discloses an ice detection system that comprises a network of thin, flexible microstrip antennas distributed on an aircraft wing at critical points and multiplexed into a microcomputer. Each sensor antenna and associated electronics measures the unique electrical properties of compounds that accumulate on the wing surface over the sensor. The electronics include provisions for sensor fusion wherein thermocouple and acoustic data values are measured. A microcomputer processes the information and can discern the presence of ice, water frost, ethylene-glycol or slush. A program executing in the microcomputer can recognize each compound's characteristic signal and can calculate the compounds thicknesses and can predict how quickly the substance is progressing toward icing conditions. A flight deck readout enables a pilot or ground crew to be informed as to whether de-icing procedures are necessary and/or how soon de-icing may be necessary.

U.S. Pat. No. 5,781,115, issued Jul. 14, 1998 to Donald F. Shea, discloses a system and method for detecting materials on a conductive surface and measuring the thickness and permittivity of the material. A polarized Radio Frequency signal is reflected from a conduction surface having a material thereon. The reflected de-polarized signal is then processed to determine the thickness and permittivity of the material on the conductive surface.

U.S. Pat. No., 5,005,015, issued Apr. 2, 1991, to Dehn et al., discloses a system and method for detecting the state and thickness of water accumulation on a surface incorporating a plurality of spaced, thin, electrically resonant circuits bonded to the surface and a radio frequency transmitter for exciting the circuits to resonance. A receiver detects the resonant signal from each circuit, determines the resonant frequency and quality factor of the circuit and correlates that information with predetermined data representing changes in resonant frequency and quality factor as a function of liquid water and ice accretion to thereby establish the state and thickness of water overlaying the circuits.

U.S. Pat. No. 4,766,396, issued Aug. 23, 1988, to Taya, et al., discloses a current source type current output circuit for applying to a load a current which is proportional to an input includes an amplifier of the type receiving a current and producing a voltage, and a feedback circuit for feeding back an output of the amplifier to an input terminal of the amplifier. The feedback circuit is made up of a first, a second, and a third current mirror circuit, and a first, a second, and a third resistor. An output terminal of the amplifier is connected to an input terminal of the second current mirror circuit via the third resistor and to an input terminal of the first current mirror circuit via a series connection of the first and second resistors. The load is connected to the intermediate point of the serial connection of the first and second resistors. An output terminal of the second current mirror circuit is connected to an input terminal of the third current mirror circuit. Output terminals of the first and third current mirror circuits are connected to an input terminal of the amplifier such that a current which is proportional to an input is fed to the load. A reference terminal of each of the first and second current mirror circuits is connected to a first power source, and a reference terminal of the third current mirror circuit is connected to a second power source.

U.S. Pat. No. 4,688,185, issued Aug. 18, 1987 to Magenheim et al., discloses an ice measurement instrument including a waveguide operating in a transmission mode passing energy from an input port to an output port. The resonant frequency of the waveguide depends on the presence and/or thickness of ice at a measuring location. The energy applied to the input port is swept in frequency from a first frequency to a second frequency at or above an ice-free resonant frequency of said waveguide, and back to said first frequency. Energy received at the output port is peak detected to provide a detection signal with four recognizable transitions identifying a pair of peaks which correspond to the resonant frequency of the waveguide. The time delay between these peaks can be used, in comparison with the time delay corresponding to an ice-free condition, to determine ice thickness.

U.S. Pat. No. 4,649,713, issued Mar. 17, 1987, to Donald J. Bezek, discloses a sensing and control device provided for monitoring the build up of frost, ice and condensate on the cooling coils of refrigeration unit. The microwave unit is placed a fixed distance away from a cooling coil and provides an emitted wave and reflected wave. The reflected wave, and the resulting standing wave, shift in spacial phase which differs due to the accumulation of ice or frost and provides a voltage change which is observed by an electronic circuit to shut off until the ice melts. The sensing and control unit is also used to sense the removal of ice and frost by heating of the defrost cycle and thus establish the termination of defrost cycle and restoration of refrigeration. The microwave sensing device permits the refrigeration unit to be cycled on and off to prevent an excessive build-up of ice which would dramatically lower unit efficiency by preventing the circulation of cooling air across the heat exchanger or coil as it is called to circulate cool air into the contiguous space.

U.S. Pat. No. 4,470,123, issued on Sep. 4, 1984, to Magenheim et al., discloses a system for indicating ice thickness and rate of ice thickness growth on surfaces. The region to be monitored for ice accretion is provided with a resonant surface waveguide which is mounted flush, below the surface being monitored. A controlled oscillator provides microwave energy via a feed point at a controllable frequency. A detector is coupled to the surface waveguide and is responsive to electrical energy. A measuring device indicates the frequency deviation of the controlled oscillator from a quiescent frequency. A control means is provided to control the frequency of oscillation of the controlled oscillator. In a first, open-loop embodiment, the control means is a shaft operated by an operator. In a second, closed-loop embodiment, the control means is a processor which effects automatic control.

U.S. Pat. No. 4,054,255, issued Oct. 18, 1977, to Bertram Magenheim, discloses a system for detecting ice on exterior surfaces of aircraft by transmitting a relatively low power microwave electromagnetic signal into a dielectric layer functioning as a surface waveguide, and monitoring the signals transmitted into and reflected from the waveguide. The waveguide includes a termination element which is mismatched with the waveguide impedance, resulting in partial or total reflection of the microwave energy from the remote end of the waveguide. As ice builds up on the surface waveguide, the impedance or reflection characteristics of the composite waveguide comprising the ice layer and the permanent surface waveguide give a reliable indication of the presence and location of the ice. The reflection characteristics are conventionally monitored utilizing a dual directional coupler and a reflectometer.

U.S. Pat. No. 5,497,100, issued Mar. 5, 1996, to Reiser et al., discloses a surface condition sensing system which includes a frequency controlled source of electromagnetic power adapted to produce a band of selected frequencies which are directed to a surface under examination. A monitoring circuit compares transmitted and reflected electromagnetic power as a function of frequency from the surface, and generates a plurality of absorption signals representing the difference between the amplitude of the transmitted signal with the corresponding amplitude of the reflected signal. An evaluator circuit generates a surface condition signal representing the results of a comparison between the plurality of absorption signals with known surface models. A control circuit generates a status signal representative of the surface condition.

U.S. Pat. No. 5,772,153, issued Jun. 30, 1998, to Abaunza et al., discloses an icing sensor utilizing a surface gap transmission line along which a radio frequency is transmitted. The phase delay of the radio frequency along the transmission line is dependent upon the dielectric constant presented at the surface in the gap between the transmission line electrodes. Accordingly, changes of dielectric constant affect phase delay of the transmitted frequency. This phase delay may be used to detect the difference between ice, water and snow as well as the presence of freezing point depressing fluids such as ethylene glycol. When the sensor is mounted on an aircraft control surface, the presence and likelihood of icing conditions may be predicted. Through the use of one or more temperature, freezing point depressing fluids/water mixture determined from dielectric constant, and rate of change of the dielectric constant, it is possible to predict the time delay until icing begins. Thus, the sensor of the present application may safely reduce the effort and expense in aircraft de-icing.

The above cited prior art does not provide a sensor that is conformable to a surface and extendable along the length of a surface, such as an airplane wing, that provides information about the type of material of superstrate on the sensor and the location of an ice superstrate along the sensor. The sensor(s) of the present invention may be used on conductive and non-conductive surfaces. Multiple sensors may be used with one quadrature phase detector. The prior art does not disclose sensors that are spaced along a transmission line to provide additive phase shift at the detector making it possible to have ten or more sensors on one strip or transmission line covering many feet of surface. Moreover, the prior art does not disclose sensors that can be spaced at desired intervals by changing the frequency of operation as well as by spacing along the transmission line. The cited art does not provide for a sensor as described that detects very thin coatings of a superstrate such that it is sensitive to a one millimeter coating of a superstrate such as ice. The prior art does not include a computer model operable to test various sensor configurations and provide additional baseline data.

Consequently, there is a strong need for such a sensor that would be useful in many applications such as detecting ice on an airplane wing. Those skilled in the art have long sought and will appreciate the present invention that addresses these and other problems.

SUMMARY OF THE INVENTION

One object of the present invention is to provide an improved instrument and method for identifying the composition of a superstrate located on a sensor, e.g., determining whether or not ice is present on an airplane wing or on a road.

Another object of the present invention is to provide a flush mounted sensor that will conform to a desired shape such as the shape of an airplane wing or road.

Another object of the present invention is to identify the extent to which one or more superstrates may cover a sensor having an extended length, e.g., such that the sensor may be used to span the relevant portion of an airplane wing.

Yet another objective of the present invention is to determine a changing dielectric constant so as to identify the material on a surface of a sensor.

One feature of the invention is the accurate determination of dielectric properties so as to distinguish air, ice, water, and glycol.

Any listed objects, features, and advantages given herein are not intended to limit the invention or claims in any conceivable manner but are intended merely to be informative of some but not all of the objects, features, and advantages of the present invention. In fact, these and yet other objects, features, and advantages of the present invention will become apparent from the drawings, the descriptions given herein, and the appended claims.

Accordingly, an instrument is disclosed for detecting one or more superstrates comprising elements such as a transmission line and a substrate mounted on an opposite side of the transmission line from the one or more superstrates to be detected. In one embodiment, a plurality of measurement cells are formed within or along the transmission line. A microwave source is used to apply a microwave signal to the transmission line and to each of the plurality of measurement cells formed within or along the transmission line. A detector, such as a phase detector and/or magnitude detector, is used for detecting the superstrate(s) with respect to the plurality of measurement cells. In one embodiment of the invention, the microwave signal may comprise multiple frequencies. In another embodiment, a second transmission line or multiple transmission lines may be used. The second transmission line may be configured to produce a detected signal more sensitive to a thickness of the superstrates than the first transmission line. In one embodiment, the first transmission line is configured to provide a signal to the detector that is substantially unaffected by a thickness of one or more superstrates and so could be used to effectively answer the question whether an ice superstrate is present or not. The second transmission line then uses the knowledge that ice is present in order to determine the thickness of the ice superstrate.

Each of the plurality of measurement cells may be spaced apart along the transmission line with respect to each other. A known superstrate may cover a plurality of non-measurement portions of the transmission line not including the measurement cells. The one or more superstrates for detection with respect to the measurement cells are substantially, partially, or completely unknown. In a preferred embodiment, each of the plurality of non-measurement portions of the transmission line have a length equal to an effective wavelength of the microwave signal divided by two. At least a portion of the measurement cells may be physically partitioned from the plurality of non-measurement portions of the transmission line. Alternatively, at least a portion of the measurement cells may be nonphysically partitioned from the plurality of non-measurement portions of the transmission line. In one preferred embodiment, the sensor comprises a plurality of transmission lines with a plurality of measurement cells formed on each of the plurality of transmission lines. In this case, a multiplexor may be provided for switching between the plurality of transmission lines. The transmission line may be uniform along its length without discontinuities. Alternatively, a plurality of discontinuities may be formed within the transmission line. The plurality of discontinuities could comprise a plurality of stubs extending from the transmission Line. The plurality of stubs could form the plurality of measurement cells. Alternatively, the plurality of stubs form markers between the plurality of measurement cells. The plurality of discontinuities could comprise a plurality of power dividers. Also, the stubs may be either open circuit or short circuit stubs.

In one embodiment, the transmission line further comprises a coplanar waveguide with a center conductor mounted between two outer conductors. In this embodiment, the center conductor is mounted so as to define first and second spaces or gaps between the center conductor and each of the two outer conductors. Preferably, the first and second spaces are equal in width. The first and second spaces may, in a preferred embodiment, each have a width chosen such that an electric field is kept substantially close to the transmission line and so able to detect a superstrate having a thickness of less than two millimeters. In one embodiment, the substrate has a thickness of less than one tenth inch. The substrate may be chosen to have a dielectric constant less than five when the instrument is used as an ice detector. In one embodiment, at least one of the superstrates or a portion thereof is formed of a porous material. As well, at least a portion of the substrate may be formed of a porous material. One purpose of the porous material may be to absorb liquid during high wind loads.

Each of the respective spacings between the center conductor and the two outer conductors may be selected for controlling a measurement depth of the superstrate. The center conductor and the two outer conductors are preferably oriented parallel with respect to each other. The substrate is mounted on an opposite side of the waveguide sensor from the superstrate. In this embodiment, each of the respective spacings may be less than one-hundredth of an inch. The respective spacings may advantageously be selected for detecting a superstrate less than two millimeters thick. In a preferred embodiment, each of the respective spacings is equal.

A plurality of measurement cells may be disposed along the center conductor and the two outer conductors. Furthermore, a plurality of non-measurement portions may be disposed along the center conductor and the two outer conductors wherein at least a portion of the measurement cells may be physically partitioned from the plurality of non-measurement portions. At least a portion of the measurement cells may also be nonphysically partitioned from the plurality of non-measurement portions.

A second waveguide may be included for determining a thickness of the superstrate. The second waveguide may have a single elongate conductive strip, a conductive ground plane, and a second substrate separating the elongate conductive strip and the conductive ground plane.

Another type of waveguide sensor for detecting one or more superstrates may comprise a single elongate conductive strip, a conductive ground plane, and a substrate mounted on an opposite side of the one or more superstrates, the substrate separating the single elongate conductive strip and the conductive ground plane. In one embodiment, a plurality of measurement cells are disposed along the single conductive strip. As well, a plurality of non-measurement portions may be disposed along the single conductive strip with at least a portion of the measurement cells being physically partitioned from the plurality of non-measurement portions. Alternatively, the measurement cells may be nonphysically partitioned from the plurality of non-measurement portions. If desired, the substrate may be selected to enhance sensing a thickness of the superstrate up to about one inch.

A waveguide, which may be an additional waveguide, comprising a center conductor and two outer conductors mounted may be used whereby the center conductor is disposed between the two outer conductors forming a space on either side of the center conductor and the spacing is selected such that a signal produced by the waveguide is substantially insensitive to the thickness of the superstrate.

The present invention provides for a computer simulation used for predicting results of a simulated superstrate detector wherein the simulated superstrate detector comprises a transmission line with a plurality of sensors along the transmission line. The computer simulation has a first input for a transmission line substrate thickness, and a second input for a transmission line substrate dielectric constant. A third input is provided for producing a change in simulated conditions related to a simulated superstrate. For instance, the third input may relate to a temperature change or starting or ending temperatures for ambient conditions with respect to a simulated ice or water superstrate. A fourth input allows entry of an operating frequency, and an output is provided for the predicted results from the simulated superstrate detector. Other factors such as the size of each of the plurality of sensors may be used as an input.

In one embodiment of the computer simulation, possible superstrates to be detected are defined. For instance, possible superstrates may be limited to air, water, ice, glycol and mixtures of water, ice, and glycol.

A method of detecting one or more superstrates on a transmission line is also provided and may comprise steps such as providing a plurality of measurement cells within the transmission line and applying a signal to the transmission line such that the signal is applied to each of the measurement cells. An output signal from the transmission line for the detection of the one or more superstrates is measured and may include measuring a phase of the output signal or measuring both a phase and amplitude of the output signal.

The method may include providing a plurality of transmission lines wherein each of the plurality of transmission lines contains a plurality of measurement cells. In this embodiment, it may be desirable to provide a multiplexor to separately and sequentially sample each respective output signal from each of the plurality of transmission lines. The plurality of transmission lines may be utilized to determine a position of the one or more superstrates, e.g., the location of ice on an airplane wing. A plurality of measurement cells on each of the plurality of transmission lines may be used to enhance the determining of the position of the one or more superstrates. A first of the plurality of measurement cells on a first of the plurality of transmission lines may be staggered with respect to a second of the plurality of measurement cells on a second of the plurality of transmission lines. The transmission lines may each have different lengths. Different frequencies may be utilized on the plurality of transmission lines.

A first transmission line may be used for detecting a presence of one or more superstrates, and a second transmission line for may be used for detecting a thickness of the one or more superstrates when the presence of a particular superstrate, e.g., ice, is detected.

Another aspect of the invention provides a method of determining a respective dielectric constant associated with one or more superstrates positioned along a waveguide at a plurality of measurement positions. The method comprises steps such as providing that characteristic impedance and propagation constants of the waveguide are known for the case when the waveguide is covered by the one or more superstrates. A plurality of frequencies may be applied to the waveguide and an amplitude and phase measured for each of the plurality of frequencies to produce an observed data vector. A complex dielectric constant may be estimated for each of the one or more measurement positions to produce an estimated data vector. The observed data vector is then compared with the estimated data vector to produce a difference data vector. The steps of estimating and comparing are preferably reiterated until the difference data vector approaches zero and so that a final estimated complex dielectric may be determined for each of the one or more superstrates. In one embodiment, values of the estimated complex dielectric constant for each of the one or more measurement positions are constrained to discrete values associated with one or more anticipated superstrates. In another aspect, a change of the observed data vector is compared with a known rate of change, e.g., the known rate of change is from water to ice. Another known rate change might be a fast change from ice to air due to a strong wind event. When the dielectric constants are slowly changing then the method may be optimized by using the final estimated complex dielectric constant for each of the one or more superstrates as a first iteration, estimated complex dielectric constant for each of the one or more superstrates.

In another embodiment an ice detector may comprise one or more elongate transmission lines greater than twenty feet long. The transmission lines may be used to span the length of an airplane wing and therefore may range from ten feet to forty or fifty feet or more as necessary for this purpose. The transmission lines preferably have a thickness small enough so as to substantially conform to the surface such as the surface of an airplane wing so that airflow pattern is not changed. It is desirable that one or more metallic covered measuring cells be provided along the one or more elongate transmission lines so that the surface of the ice detector is similar to the metallic surface of the airplane wing. A plurality of frequencies may be generated and a computer may apply a fast Fourier transform for a time-domain interpretation of signals from the one or more transmission lines.

Other aspects of the present invention are provided in the following figures, description and claims.

While the present invention will be described in connection with presently preferred embodiments, it will be understood that it is not intended to limit the invention to those embodiments. On the contrary, it is intended to cover all alternatives, modifications, and equivalents included within the spirit of the invention and as defined in the appended claims.

BRIEF DESCRIPTION OF PREFERRED EMBODIMENTS

Figure 2:
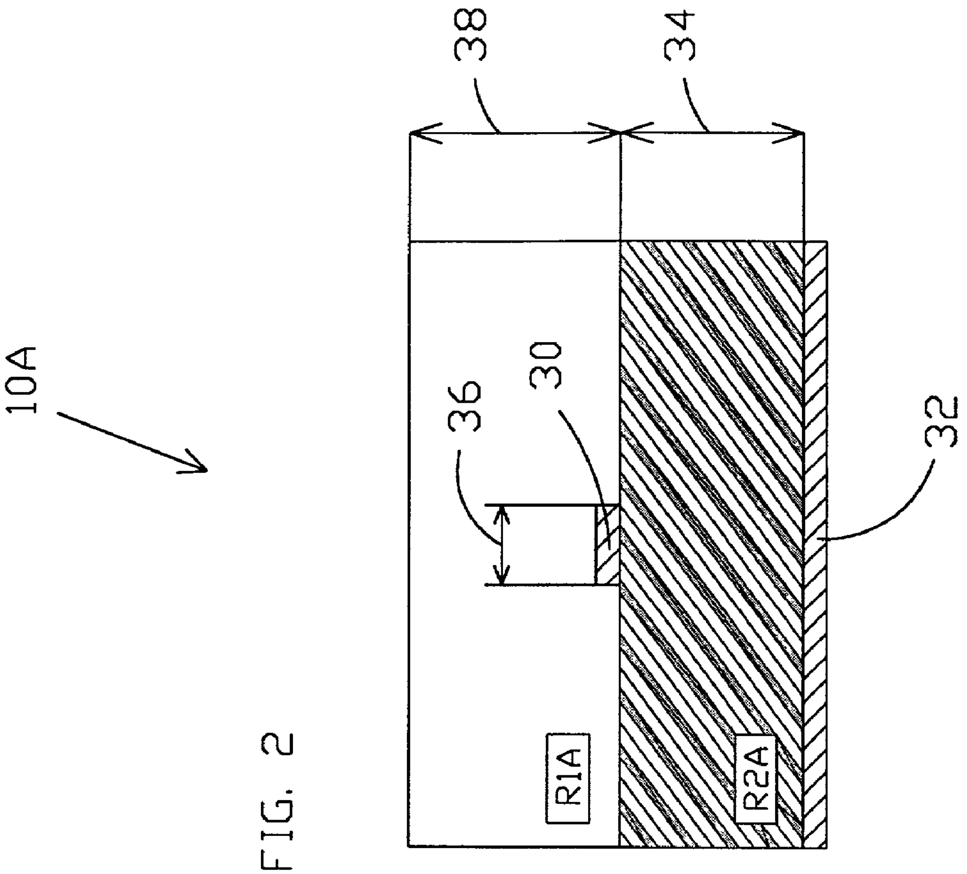
FIG. 2 is a schematic drawing, in section, showing the cross-sectional construction of a microstrip transmission line sensor in accord with the present invention.
Figure 1:
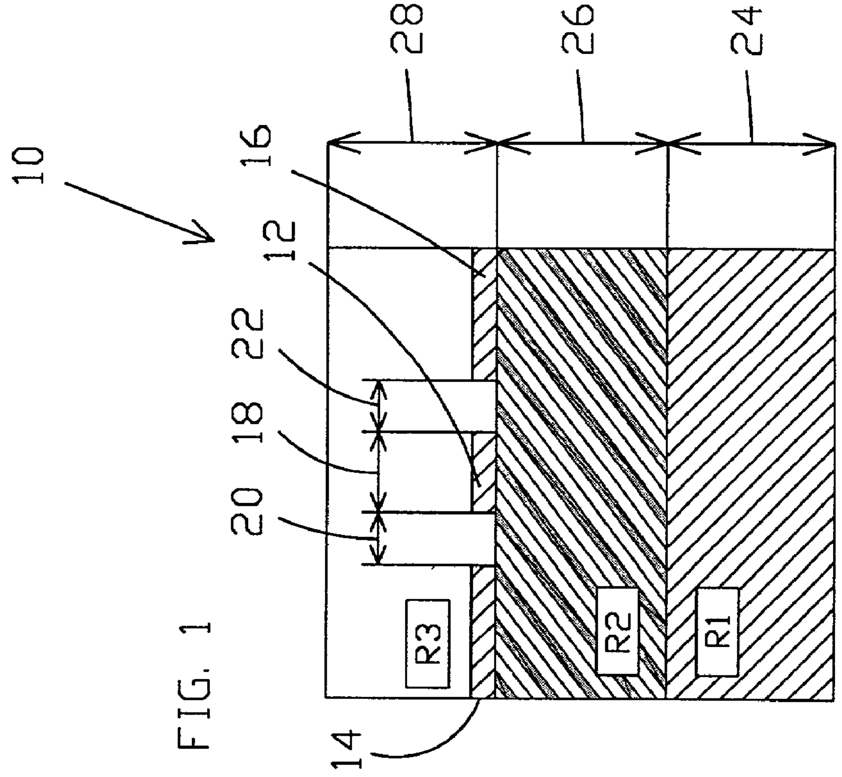
FIG. 1 is a schematic drawing, in section, showing the cross-sectional construction of a coplanar transmission line sensor in accord with the present invention.

Referring now to the drawings, and more particularly to FIG. 1 and FIG. 2, the present invention discloses transmission line sensors such as sensor 10 and 10A, respectively. Transmission lines are conductors that may be used to carry power. In a preferred embodiment of the present invention, the transmission line sensors are waveguide transmission lines especially useful for carrying microwave or radio frequency power. Sensors 10 and 10A described herein may be used independently from each other. Alternatively, sensors 10 and 10A may be used in a single system with multiple functions that has the ability to detect the superstrate formation identity and, under certain conditions, the thickness and rate of accretion of a superstrate such as thickness of an ice layer covering the sensors. Sensor 10 is referred to herein as a coplanar waveguide and sensor 10A is referred to herein as a microstrip line waveguide. Sensor 10 and sensor 10A preferably operate in the microwave frequency range. Sensors 10 and 10A are especially suited to detect a specific set of materials most likely to appear on the wing, i.e., air, ice, water, and ethylene glycol (chemical used to remove ice from the wing). However as discussed briefly above, there are many potential applications for sensors of this type in industry and government. Examples of possible applications include detection of ice formation on the External Tank (ET) of the Space Shuttle. Other possible industrial uses include detection of the presence or absence of a coating, e.g., lubricants, paint, and the like. The sensor may be especially designed to be sensitive to a coating of a particular thickness. The sensor may be used as a level detector in a tank or pit. The sensors may be used as a proximity sensor, for detection of ice on bridges, viaducts, and the like. Another possible use would be as a detector of residual substances adhering to the inside of oil pipelines.

Electromagnetic waves on a transmission line are guided by the conductor configuration of the transmission line. In FIG. 1, center conductor 12 cooperates with outer conductors 14 and 16 to conduct electromagnetic waves along the transmission line in the gaps formed between center conductor 12 and the outer conductors. The waveguide cross-sectional structure shown in FIG. 1 may be fabricated using printed circuit board techniques so that center conductor 12 and outer conductors 14 and 16, which are typically ground planes, may be very thin layers of metal separated by narrow gaps. In a normally preferred embodiment, outer conductors or ground planes 14 and 16 are much wider than the width, 18, of the center conductor 12. Region R3 is the region wherein a superstrate, e.g., ice or water, may be disposed with respect to sensor 10. Region R2 is a selected substrate of insulative material that will typically have a known dielectric constant. Region R1 may be formed of either conductive or nonconductive material with a known dielectric constant. For instance, this region may be formed by the surface of an airplane wing itself or it may be a ground plane that could be attached to the airplane wing.

In operation, the characteristics of the transmission line waveguide of FIG. 1 are altered by the surrounding regions and notably the dielectric constant of superstrate R3 which will be a variable, e.g., superstrate R3 may change from water to ice to thereby change the dielectric constant of superstrate R3. In the case of the coplanar waveguide of sensor 10 as shown in FIG. 1, the effective dielectric constant $\epsilon_{eff}$ and characteristic impedance $Z_0$ are altered as the dimensions and properties of the overlying substances, i.e., superstrates R3 are changed. The remaining factors are typically known. These known factors include width 18 of center conductor 12, and the widths or gap spacings 20 and 22 between outer conductors 14 and 16 with respect to center conductor 12. For use as an ice detector, preferably widths or spaces 20 and 22 are equal so the transmission line of sensor 10 is balanced and does not radiate excessively. The advantages of a balanced transmission line are discussed subsequently. Other constants include the dielectric constant of region R1 and region R2 as well as their associated height or thickness as indicated at 24 and 26, respectively.

The height 28 of superstrate region R3 will vary and is typically unknown. In one presently preferred embodiment or aspect of the invention sensor design, the height or thickness 28 of superstrate region R3 may be also rendered unimportant so long as it is at least greater than a very thin layer. For instance, by controlling known widths 20 and 22, any variation in height or width 28 can be eliminated as a variable assuming superstrate R3 has a width of at least one millimeter as discussed in more detail subsequently.

The values of effective dielectric constant $\epsilon_{eff}$ and characteristic impedance $Z_0$ can be computed using published formulas and equations readily available to those experienced in the art of microwave/rf design.

It may be desirable to use an observable variable that is easily extrapolated from the actual electronics and also relates to the substance covering the waveguide. The phase angle of the reflection parameter, S11, associated with reflected energy from the waveguide, is such a value. The reflected phase is a function of the waveguide Beta (proportional to $\sqrt{\epsilon_{eff}}$) and $Z_0$, which can be extracted from the measurement in a fairly straightforward manner. The term cpw as used herein refers to the coplanar wave guide (cpw) structure of sensor 10. The theoretical computation is derived from the following definitions and equations:

Z(z)=The impedance as a function on the position of the cpw $Z_o$=The characteristic impedance of the cpw ZL=The load impedance at the end of the waveguide $Z_m$=The input impedance at −z $Z_o$=50Ω

Γ(−z) =The reflection coefficient at −z

Γ=The reflection coefficient for the cpw sensor $$\tilde{Z}(z)=\frac{\tilde{V}(z)}{\tilde{I}(z)}=\tilde{Z}_o\frac{1+\tilde{\Gamma}(z)}{1-\tilde{\Gamma}(z)}$$

$$\tilde{Z}(-z)=\tilde{Z}_o\frac{1+\tilde{\Gamma}(-z)}{1-\tilde{\Gamma}(-z)}$$

$$\tilde{\Gamma}(-z)=\tilde{\Gamma}(0)e^{2\gamma(-z)}$$

$$\tilde{Z}(-z)=\tilde{Z}_o\frac{1+\tilde{\Gamma}(0)e^{2\gamma(-z)}}{1-\tilde{\Gamma}(0)e^{2\gamma(-z)}}$$

$$\tilde{\Gamma}(0)=\frac{\tilde{Z}_L-\tilde{Z}_o}{\tilde{Z}_L+\tilde{Z}_o}$$

$$\tilde{Z}(-z)=\tilde{Z}_o\frac{1+(\tilde{Z}_L-\tilde{Z}_o)/(\tilde{Z}_L+\tilde{Z}_o)e^{-2\tilde{\gamma}z}}{1-(\tilde{Z}_L-\tilde{Z}_o)/(\tilde{Z}_L+\tilde{Z}_o)e^{-2\tilde{\gamma}z}}$$

$$\tilde{Z}(-z)=\tilde{Z}_o\frac{\tilde{Z}_L\cosh(\tilde{\gamma}z)+\tilde{Z}_o\sinh(\tilde{\gamma}z)}{\tilde{Z}_o\cosh(\tilde{\gamma}z)+\tilde{Z}_L\sinh(\tilde{\gamma}z)}$$

$$\tilde{Z}(-z)=Z_o\frac{\tilde{Z}_L\cosh(j\beta z)+\tilde{Z}_o\sinh(j\beta z)}{\tilde{Z}_o\cosh(j\beta z)+\tilde{Z}_L\sinh(j\beta z)}$$

$$\tilde{Z}(-z)=Z_o\frac{\tilde{Z}_L\cos(\beta z)+\tilde{Z}_o\sin(\beta z)}{\tilde{Z}_o\cos(\beta z)+\tilde{Z}_L\sin(\beta z)}$$

Since the waveguide may be constructed with an open-circuited end, ZL=∞, the previous equations reduce to:

$$Z(-z)=-jZ_o\cot(\beta z)=Z_m$$

Now solving for the phase angle:

$$\Gamma=\frac{Z_m-Z_o}{Z_m+Z_o}=\frac{-j\tilde{Z}_o\cot(\beta z)-Z_o}{-j\tilde{Z}_o\cot(\beta z)+Z_o}$$

$$\Gamma=-\frac{Me^{j\alpha}}{Me^{-(j\alpha)}}=-e^{j2\alpha}=e^{j(2\alpha+\Pi)}=e^{j\theta}$$

$$\theta=2\alpha+\Pi \text{ where } \alpha=\tan^{-1}\left[\frac{\tilde{Z}_o\cot(\beta z)}{Z_o}\right]$$

$$\theta=2\tan^{-1}\left[\frac{\tilde{Z}_o\cot(\beta z)}{Z_o}\right]+\pi$$

This last equation now shows that θ is a function of the dielectric constant and height of the superstrate material. All of the independent variables discussed above for these listed equations will normally remain constant except as noted for the dielectric constant of superstrate region R3 and height thereof as indicated at 28. Therefore, the result is a variable that is fairly easy to obtain from the circuitry and is a function of the overlying substance of the waveguide, i.e., superstrate region R3.

In the microstrip transmission line sensor 10A of FIG. 2, which is a type of printed circuit waveguide, the electromagnetic field is not confined to the surface to the same degree as the coplanar waveguide of sensor 10. However, in the case of sensor 10A, as well as in the case of sensor 10, the effective dielectric constant $\epsilon_{eff}$ and characteristic impedance $Z_0$ of the circuit changes as the dimensions and dielectric properties of the microstrip line superstrate R1A change. As before, certain values related to the construction details of the waveguide are known. Conductor 30 is a microstrip conductor and conductor 32 is the ground plane for the microstrip transmission line of sensor 10A. Microstrip conductor 30 has a width 36. The dielectric constant of substrate region R2A is known. Also the thickness or height 34 of region R2A is known. The thickness or height 38 of region R1A and dielectric constant of region R1A is typically unknown and is the superstrate to be detected. The values of $\epsilon_{eff}$ and characteristic impedance $Z_0$ for the waveguide of sensor 10A are computed with the following mathematical operations, which may be obtained via the spectral domain immittance method.

Both the cpw and microstrip sensors may be open or short transmission lines. There may be some advantages to using a combination. Thus, since the microstrip line may also be open-circuited, so by following the exact same steps listed in the derivation equations for the coplanar waveguide of sensor 10, the equation for the microstrip input impedance is:

$$Z(-z)|_{-z=b}=-jZ_o\cot(k_{xo}b)=Z_m$$

Also following the same format as the calculations coplanar waveguide of sensor 10, the equation for theta becomes $$\theta = 2\tan^{-1}\left[\frac{\tilde{Z}_o\cot(k_{ko}b)}{Z_o}\right] + \Pi$$

Like the coplanar waveguide of sensor 10, the value of theta for this circuit depends on two variables: the dielectric constant of the superstrate R1A; and the thickness 38 of the superstrate R1A. Because the electromagnetic field of the microstrip line is not confined as tightly as that of the preferred coplanar waveguide of sensor 10, the theta value of the micro strip line is more sensitive to the changes in superstrate thickness than is the theta value of the coplanar waveguide of sensor 10.

Figure 6:
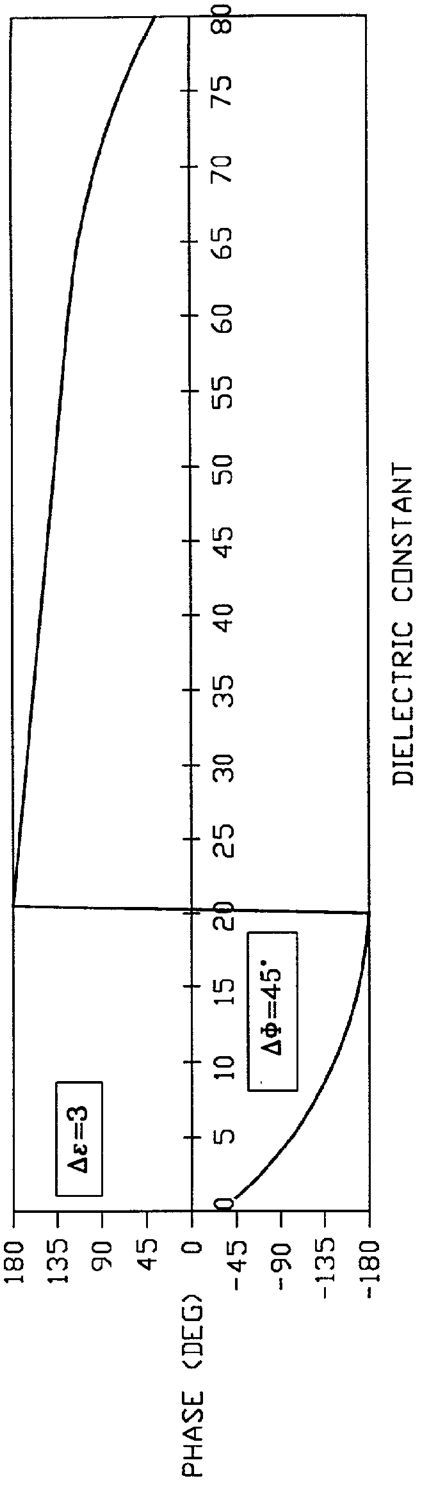
FIG. 6 is a graphical representation of change in the phase angle detected versus the dielectric constant of a superstrate disposed on a coplanar transmission line sensor for a particular length a measurement cell of a sensor.

In one embodiment of the present invention, the coplanar waveguide of sensor 10 was designed such that it would be very sensitive to the low dielectrics (i.e. approximately 1 to 10). This was needed to assure that the sensor would be able to distinguish the difference between air and ice, which have dielectrics of 1 and 3.15, respectively. The two other main substances that sensor 10 would likely see when used as an ice detection sensor, i.e., water and ethyl-glycol, have dielectric constants of 80 and 25, which are large enough that the sensors resulting phase readings clearly conclude that superstrate R3 is not ice. By adjusting the line lengths or length of the measurement cells discussed hereinafter, the sensitivity of the device can be shifted into certain ranges, and a useful range might be selected such as that of FIG. 6 wherein the change of phase at lower dielectric constants is expanded to more easily distinguish between 1 and 3.15.

Figure 7:
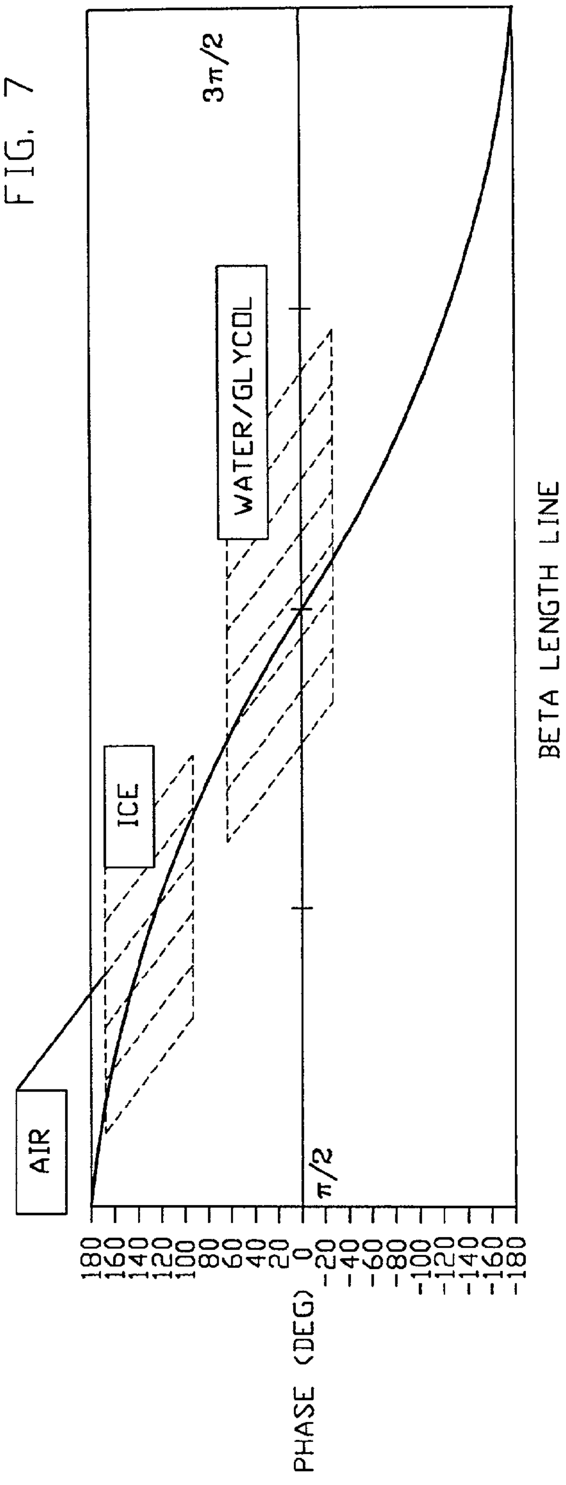
FIG. 7 is a graphical representation of the phase range of expected superstrates for an airplane ice detector with respect to beta values times line length of a measurement cell of a sensor.

The expected effective beta values of the circuit must also be considered in the determination of the line length. If the difference between (beta value for air)*(line length) and (beta value for water)*(line length) is greater than pi, the phase values for the substances may overlap resulting in the loss of the one to one relationship between a substance and its corresponding range of phases. This must be considered if the selected detection/identification method is based on the absolute phase measurement. The use of non-measurement cells or multiple frequencies provide alternatives that are not dependent on the one-to-one relationship stated above. The relationship between beta*(line length) and the phase range of the different superstrates, for the coplanar waveguide of sensor 10 is plotted in FIG. 7.

Figure 5:
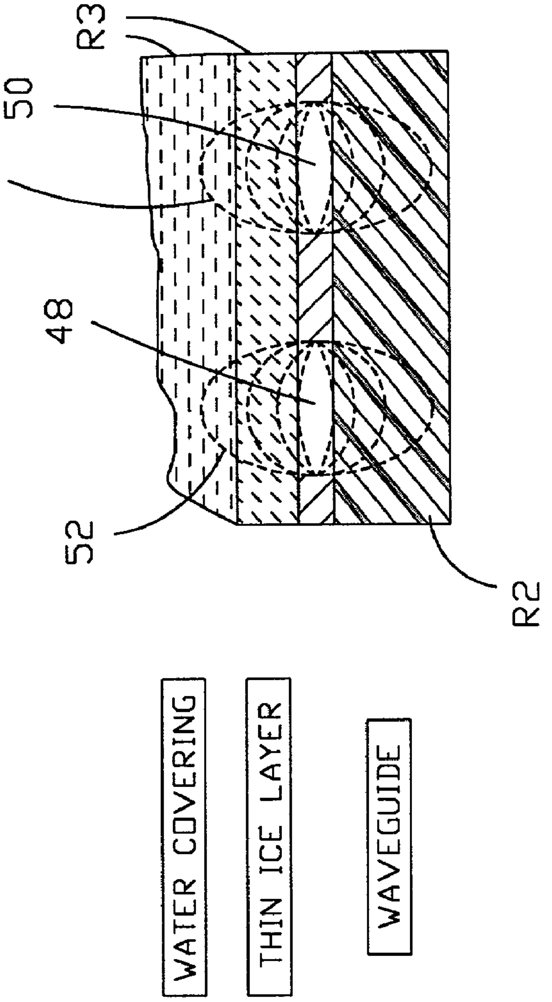
FIG. 5 is a schematic drawing, in section, showing a coplanar transmission line sensor with wide gaps wherein a thicker substrate or layers of substrate may be sensed.
Figure 4:
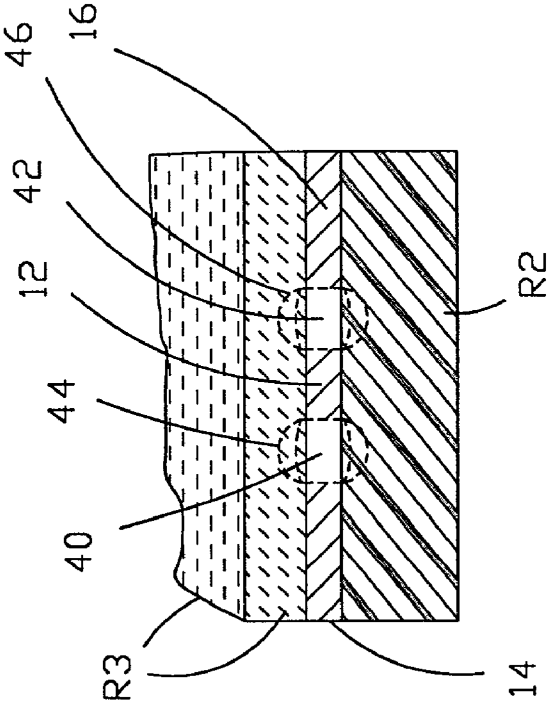
FIG. 4 is a schematic drawing, in section, showing a coplanar transmission line sensor with narrow gaps for sensitive detection of a very thin layer of a superstrate.

In one presently preferred embodiment, the function of sensor 10 is to detect the adhesion of a superstrate such as ice to the sensor surface, e.g., ice or no ice, without concern for the thickness of the ice. Therefore, the transmission line waveguide structure of sensor 10 may be designed so that the electromagnetic field remains very close to the surface of the waveguide as discussed above. This is preferably accomplished by keeping gap spaces 20 and 22 very narrow. In this way, sensor 10 may be made very sensitive to small amounts of ice buildup that rest directly on sensor 10. Wider gap spaces create an expanded electromagnetic field that reduces the waveguide sensitivity to the substance directly on top of the sensor. Referring to FIG. 4 and FIG. 5, it can be seen that narrow gaps 40 and 42 will limit the extent of the electromagnetic field as indicated by flux lines 44 and 46. For a thin ice layer, flux lines 44 and 46 of the electromagnetic field stay within the thin ice layer. With a wider spacing of gaps 48 and 50, as shown in FIG. 5, the electromagnetic field extends further outwardly as indicated by flux lines 52 and 54 so that the dielectric constant not only of ice but also of water is indicated in a mixed manner. Therefore, the sensor of FIG. 4 will properly read the adhesion of ice to the sensor, while the sensor of FIG. 5 may misread a thin coating of ice more closely to a layer of water.

Therefore, in one presently preferred embodiment, a narrow gap spacing is preferred as the desired embodiment of sensor 10 as indicated by closely spaced gaps 40 and 42. Preferably sensor 10 will have flux lines 44 and 46 substantially or completely enclosed by an ice layer which may be less than several millimeters thick. In one embodiment, gaps 40 and 42 of sensor 10 have a gap space of approximately 0.004 in. to 0.007 in. which will properly report the situation illustrated in FIG. 4 above (i.e. ice adhesion warning) as long as the thin layer of ice is greater than or equal to at least approximately 1 mm. Gaps 40 and 42 are shown in FIG. 1 as gaps or spaces 20 and 22.

Referring to FIG. 1, in one embodiment substrate R2 is selected to have a low dielectric constant, in the range of about 2.1, to increase the sensitivity of the sensor 10 by maintaining the electromagnetic field close to the surface of conductors 12, 14, and 16 when measuring superstrates R3 which also have low dielectric constants (i.e. air and ice). In this embodiment, thickness 26 of the substrate R2 (in the range of 0.062") was chosen to keep the electromagnetic field contained close to the surface of sensor 10. This selection of thickness 26 also prevents microstrip modes. At the same time, sensor 10 is quite thin, typically less than 0.07 inches so as to be able to conform to the surface of a wing or road.

Figure 3:
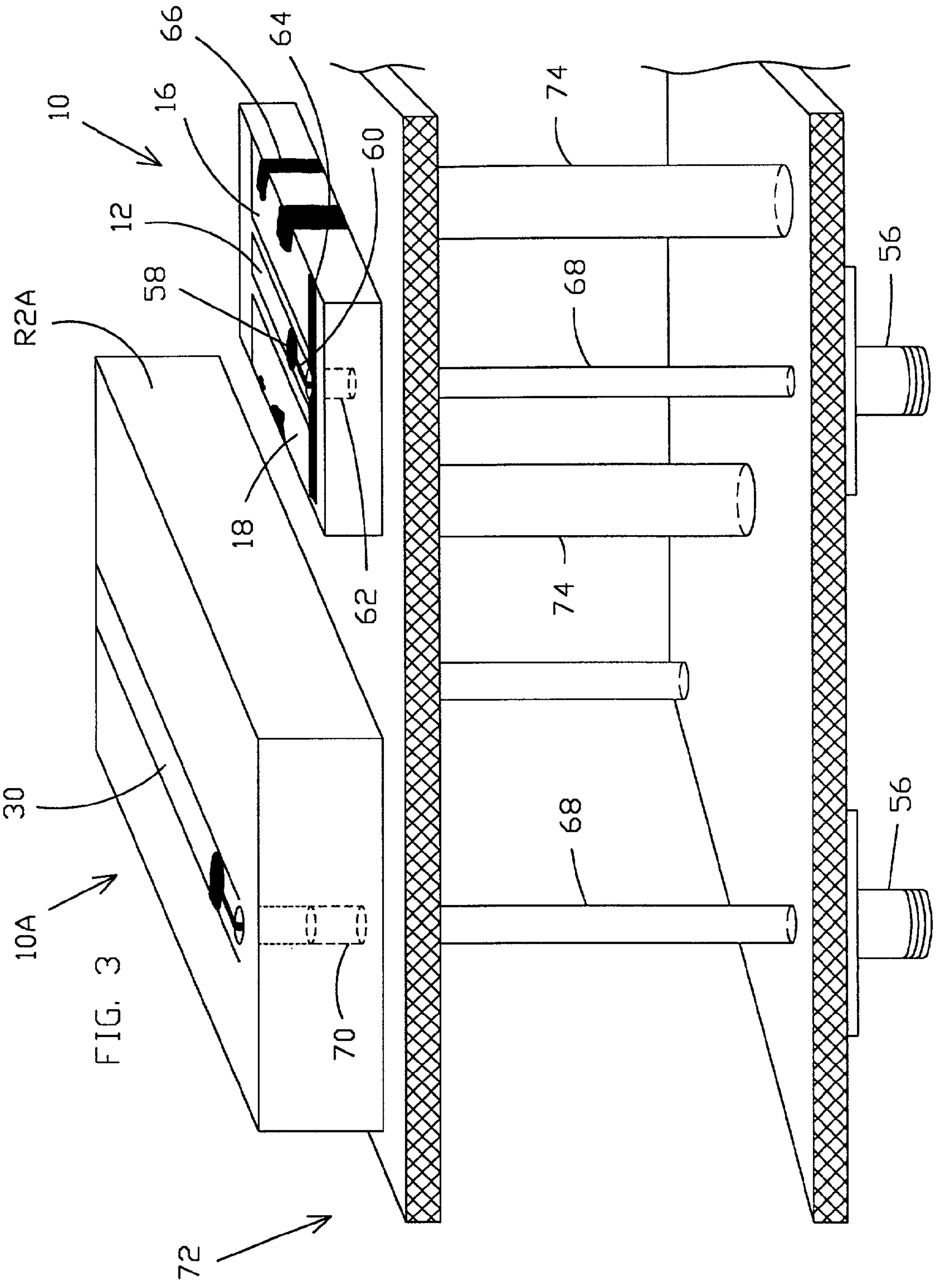
FIG. 3 is a perspective view, in section, showing connection details of a coplanar transmission line sensor and a microstrip transmission line sensor as used in a test fixture.

One possible means for providing electrical connections to sensors 10 and 10A are shown in FIG. 3 although this means is not exclusive and it will be understood there are alternatives. In this possible construction which is given only as an example, gold welds are used to connect to sensor 10 such as gold weld 58. For instance, gold weld 58 may be used to connect coax feed pin 60 to center conductor 12 of waveguide sensor 10. For this case, gold welds reduce unwanted inductance and ensure repeatability in construction of new sensors. Coax outer conductor 62 is connected by gold weld 64 to outer conductors 14 and 16 of sensor 10. Gold grounds 66 extending from R1 may also connect to outer conductors 14 and 16 where a conductive region R1 is used as a ground plane. The gold weld bonds may preferably be made with gold ribbon for good conductivity and malleability. Furthermore, the small dimensions of the gold ribbon allow precise placement of the microweld with less chance of shorting as compared to solder. In order to reduce inductance of the feed pin 60, the sensor 10 was fed by having feed pin or center conductor 60 of a coax line protruding through the 0.062" thickness of substrate R2. The above description is given as example only and is certainly not intended to be a limiting of the possible constructions of invention.

Various excitation frequencies of sensors 10 and 10A may be used as discussed subsequently including multiple and/or changing frequencies. Even low frequencies or direct current may also be used for some purposes. The anticipated superstrates to be detected should be considered in selecting the frequency or frequencies of operation. In one embodiment, a frequency of 1.3 GHz was chosen due to the loss properties of water. With the dimensions of the waveguide of sensor 10 as described, water is very lossy at 1.5 GHz. Repeatability of phase measurements becomes poor when made with lossy superstrates. Therefore, 1.3 GHz was chosen because this frequency is sufficiently low that virtually no loss occurs when measuring any of the superstrates (air, ice, water) while being high enough to keep the size of sensor 10 to a minimum.

When it is desired to use both sensor 10 and sensor 10A operating together, different frequencies may be used at each sensor. Referring to FIG. 2 for one embodiment of sensor 10A, substrate R2A is chosen to have a low dielectric constant to provide more sensitivity to ice (a substance with a low dielectric constant). The thickness of substrate R2A is strongly associated with how deep or high sensor 10 is able to see above the surface of conductor 30. In this embodiment, sensor 10A has the capability of measuring the thickness of ice up to ¾ of an inch as desired by the airlines. To accomplish this, the electromagnetic field must extend a large distance (<1") from the sensor. A substrate thickness 34 of 0.125" was found to give the sensor accurate, repeatable, and nearly linear readings up to about 0.9". With this substrate thickness, the precision of the sensor 10A declines for ice thicknesses greater than 0.25". Thicker substrates would allow for the electromagnetic field to extend further from the sensor surface, thereby giving very precise values for thicknesses above 0.25".

In the embodiment using both sensor 10 and sensor 10A together, the frequency of 2.6 GHz was selected for sensor 10A because this frequency is a second harmonic of the frequency used for the waveguide sensor 10, thereby avoiding the cost of a second signal source. Sensor 10A, at this frequency, also shows little loss when covered with ice, helping repeatability of the measurement. This frequency also seems to produce the maximum amount of phase change as thickness 38 of an ice superstrate R1A is altered.

With respect to one possible configuration for electrical connections for sensors 10A and 10 such that an example is provided that is not intended to be limiting of the various constructions that may be used, semi-rigid 0.047" diameter coax cable 68 may be provided as indicated in FIG. 3. The small diameter coax cable helps to reduce the amount of actual space occupied while ensuring that cables 68 are sturdy and will not break easily. Connectors 56 may be Huber & Suhner SMA0.047" 2-hole flange, part number 25 SMA-50-1-4C. Outer coax conductor 70 connects directly to the ground plane of sensor 10A to assure a smooth ground with little unwanted inductance. Outer coax conductor 70 may also extend upwardly halfway into substrate R2A as shown.

Test fixture 72 of FIG. 3 is made from a standard Compaq housing where the lid of the housing was removed and reattached to the bottom with ¾ inch metal spacers 74. The spacers were added to give working room for semi-rigid coax cables 68. Coax cables 68 were brought up through the bottom of the sensors to simulate the actual connection on an airplane wing.

Figure 9:
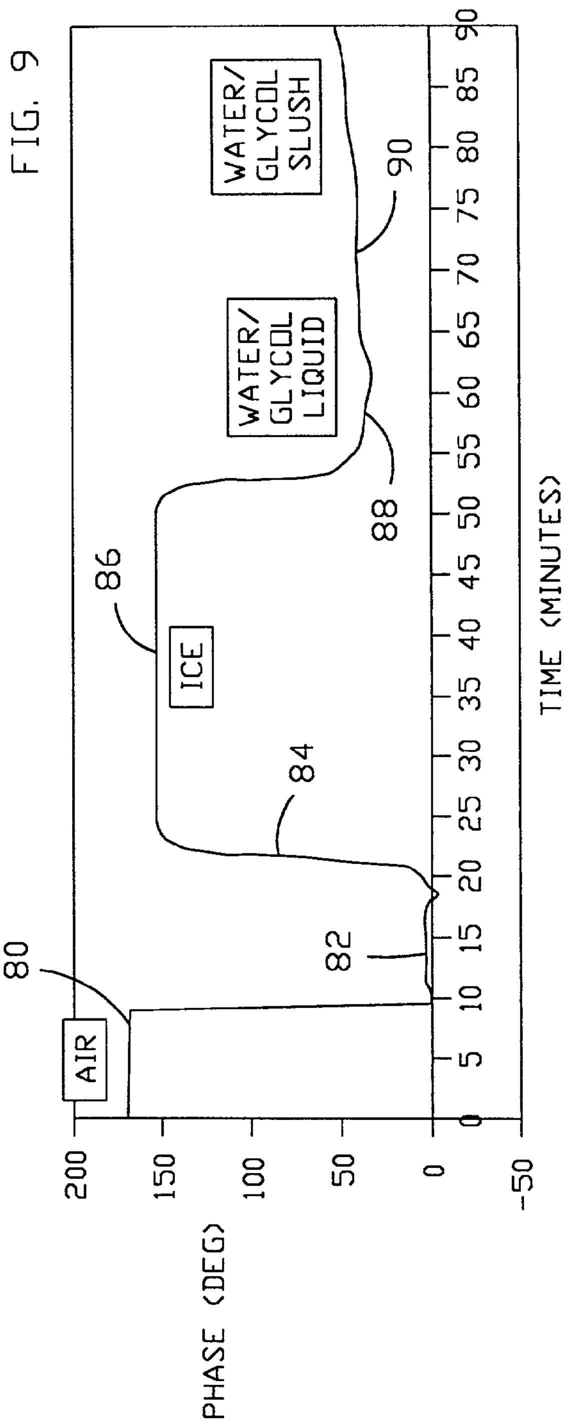
FIG. 9 is a graphical representation of phase angle versus time as superstrates on a sensor change.

In a preferred embodiment of the coplanar waveguide transmission line of sensor 10, there are two main functions. The first and most important function is the ability to identify the moment when ice has adhered to the surface as discussed above. The second function is the capability to identify transitional periods of the superstrate, e.g., the period during which change of state occurs from liquid water to solid ice. Testing has proven this system as an effective means to distinguish ice from other superstrate(s) R3 that may be present on top of sensor 10 such as water or water-glycol mixtures. As liquid water turns to ice, there are very distinct effects on the phase measurements made by sensor 10. When superstrate R3 is either water or ice, each state has a phase value that is fairly constant and discrete. The transition between the two states of water and ice is relatively quick and quite noticeable when viewed on a phase versus time plot as shown in FIG. 9. It will be noted that the phase is constant until the change in state.

Figure 11:
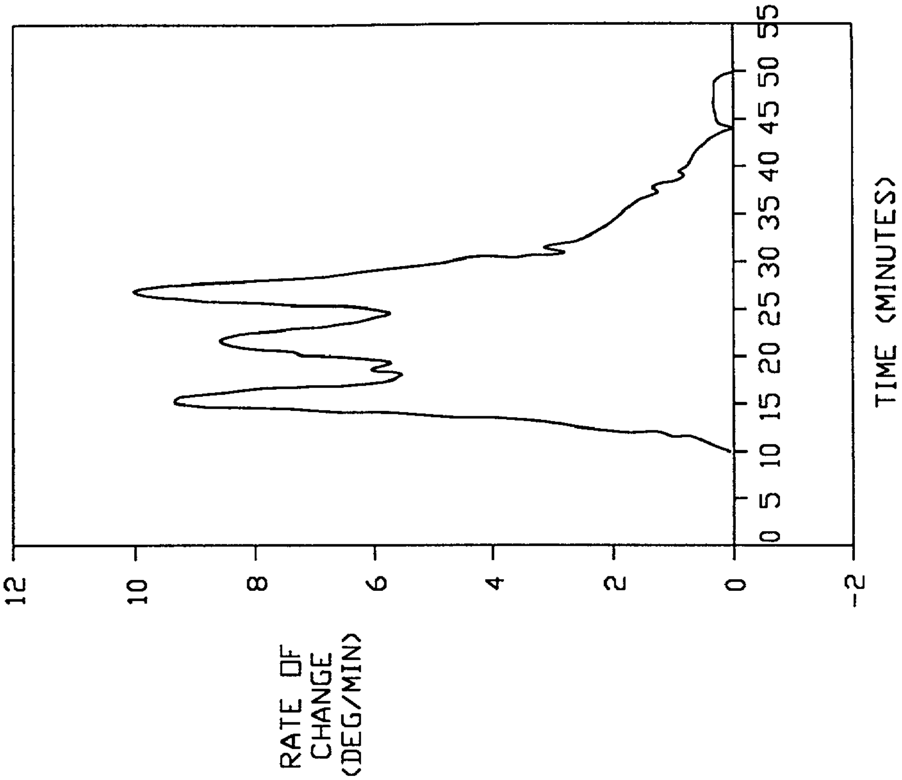
FIG. 11 is a graphical representation of rate of phase angle change versus time as a 15% glycol solution changes into ice for the same given temperature as in the graph of FIG. 10.
Figure 10:
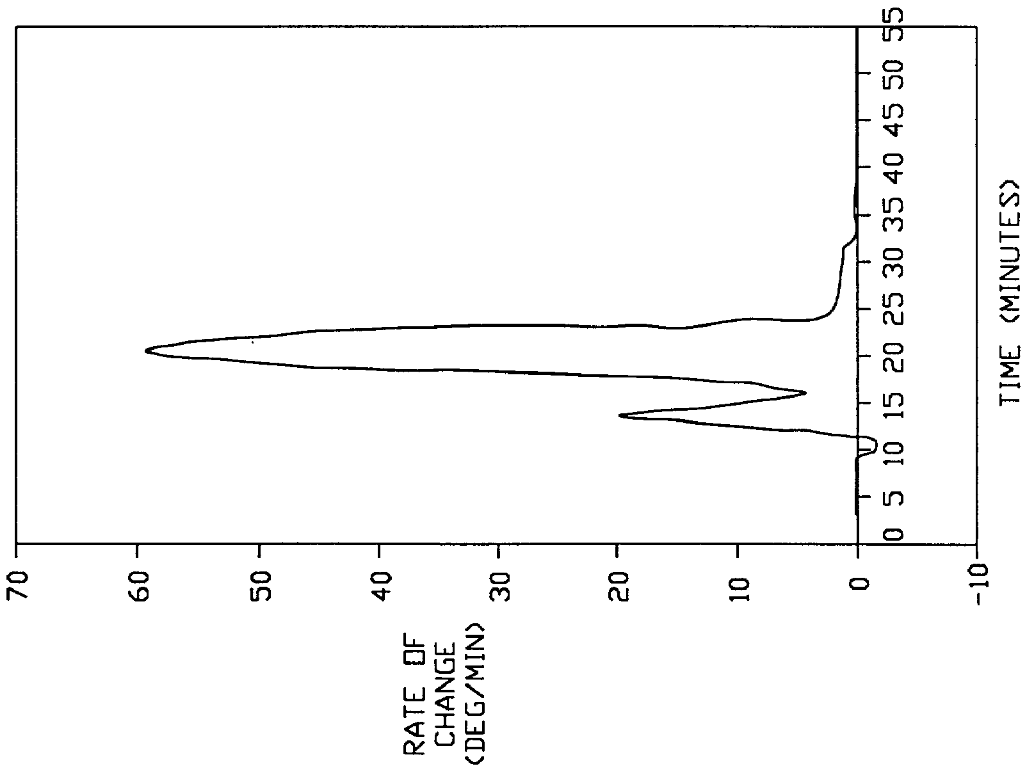
FIG. 10 is a graphical representation of rate of phase angle change versus time as water changes into ice for a given temperature.

FIG. 9, FIG. 10, and FIG. 11 show how the transition is affected by different concentrations of ethylene glycol present in the solution. Heated glycol is a chemical used to prevent and melt ice buildup on wings of airplanes. As shown by FIG. 10 where the change is from water to ice, and in FIG. 11 where the change is made in the presence of a 12.5% solution of glycol, it is clearly shown that the presence of the glycol does indeed slow down the transition from water to ice. The graphs of FIG. 10 and FIG. 11 are made at the same temperature. With a 15% concentration of ethylene glycol at −258 C the solution never becomes ice as indicated in FIG. 9 region 90. It remains in a slushy state.

FIG. 10 and 11 further illustrate the transitional period between water and ice by taking the derivative of the phase angle versus time. These graphs emphasize the characteristic that when the substance is in a constant state, the phase remains very constant but when the state is changing, the rate of phase change is quite noticeable. This information may be useful to the pilot as it indicates a change of state is occurring. This may be useful to know when the plane is on the ground waiting for take off. The knowledge of how long a change of state will take to occur would also be useful for the pilot. As well, during de-icing procedures the pilot would know when a change of state occurs.

Small phase variations (±58) result from a number of influences, such as temperature variations of the substrate and superstrate. Small phase variations may also be due to errors in the equipment used to measure phase. However, these errors are small and have minimal effect on the operation of the sensor. The major cause for phase variation of the reflected signal of the sensor is the amount of the sensor that is covered by the superstrate. If the sensor is completely covered by the superstrate, the phase values will nearly match their predicted values. Thus, a single sensor formed from a long length of transmission line may produce significant errors. The use of multiple smaller measurement cells within a transmission line sensor alleviates this problem as discussed subsequently. The problem of partial coverage of sensor 10 phase measurement arises because the readings come directly from the effective dielectric constant of the substance that fills the volume bounded by the entire line length, the distance between the two top ground planes, and a superstrate height of approximately 1 mm. If combinations of superstrates are present within this volume, the sensor will return the phase value for an effective dielectric constant for the mixture. Multiple measurement cells will alleviate this situation significantly. Furthermore when ice forms, the phase value remains virtually constant and so has a much different characteristic than the ever-changing phase values during the evaporation of water. The microprocessor could calculate the delta between phase values to determine whether the substance is ice or if it is minuscule amounts of water.

Thus, the basic measurement cell of the coplanar waveguide ice detection sensor 10 is an excellent detector of the adhesion of ice to a surface, and it also has the ability to identify transitions between water-glycol solutions and ice. By observing the rate of phase change (see FIG. 10 and FIG. 11), one can determine if the superstrate is in a transition between states. If the rate of change is approximately zero, a steady state can be assumed and a measurement of the phase value would be made to determine the identity of the state of the substance on top of the sensor.

Figure 8:
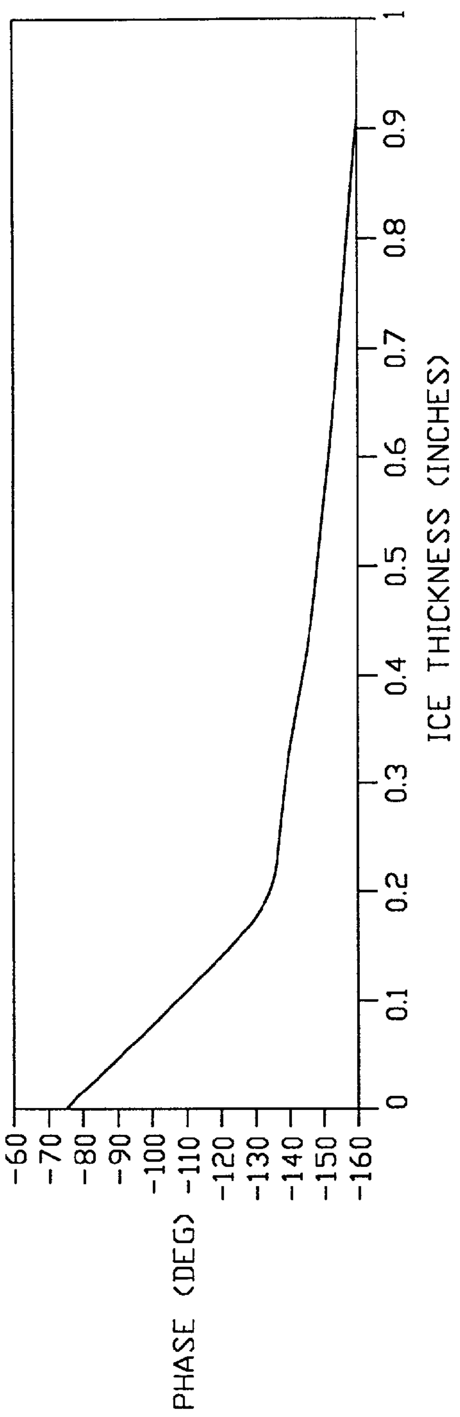
FIG. 8 is a graphical representation of phase angle versus ice thickness for microstrip transmission line sensor in accord with the present invention.

As discussed above for one embodiment of the invention, the primary function of the microstrip line sensor 10A is to give an accurate measurement of the thickness of the ice covering the sensor. Testing of the microstrip sensor 10A has proven this an effective means to calculate the thickness of the ice given certain assumptions. With this information, a simple microcomputer would then be able to track the thickness of the ice as a function of time, thereby producing the rate of accretion value that pilots would like to see. As shown in FIG. 8, using an open ended microstrip line, a distinct, repeatable, and nearly linear (2 section piecewise linear), phase and ice thickness relationship was discovered for thicknesses between 0.0" and 0.9".

Assuming that the electronics give the reflected phase measurement with an accuracy of ±18, one embodiment of the sensor can calculate ice thickness to the nearest 0.005" when the ice is less than 0.25". It can calculate to the nearest 0.05" when the ice thickness is between 0.25" and 0.75". If the sensitivity for thicknesses beyond 0.25" needs to be increased an alternate, more precise method is available.

Raton Inc. has developed a resonant patch antenna for determining ice thickness on a surface based on a resonant frequency of the ice. This becomes a very accurate method for calculating ice thickness above 0.25" even though measuring the phase of the reflected signal as with sensor 10A is a less costly and less complex process. The microstrip sensor 10A has been designed to operate at 2.6 GHz, which by design is a second harmonic of a frequency that may be conveniently used for the coplanar waveguide sensor 10.

FIG. 9 shows the result of a test performed in a small thermal chamber. The test attempted to simulate a series of events that sensor 10 would likely see on the wing of an airplane. The following chart summarizes the test procedures and results.

TABLE 1

Description of Test Phases (see FIG. 9)

| Scenario: | Test Procedure: | Result: |
|---|---|---|
| A dry airplane wing (region 80) | Sensor is placed in a thermal chamber | Sensor shows a steady phase value of 170° |
| Wing becomes wet as a result of rain or snow (region 82) | Water is placed so it covers entire sensor surface | Phase suddenly drops to 0° and remains steady |
| Water beings to freeze ( 84) | Chamber cooled to −25° C. | Phase value increases |
| Ice forms on wing (region 86) | Sensor is surrounded by ice | Phase is a constant 140° |
| Plane initiates de-icing measures (region 88) | Heated 50/50 mixture of water/glycol is poured on ice | Phase value decreases |
| Chemical prevents ice from forming (region 90) | Covering does not solidify even at −25° C. | Phase value remains fairly constant at about 35° |

The presence of glycol in the water does not degrade the sensor, but it does modify the detection process. The transition period between liquid/solid and solid/liquid state becomes longer when glycol is present as shown in FIG. 10 and FIG. 11. In fact, the time of transition is a function of the percentage of glycol in the water.

Figure 12:
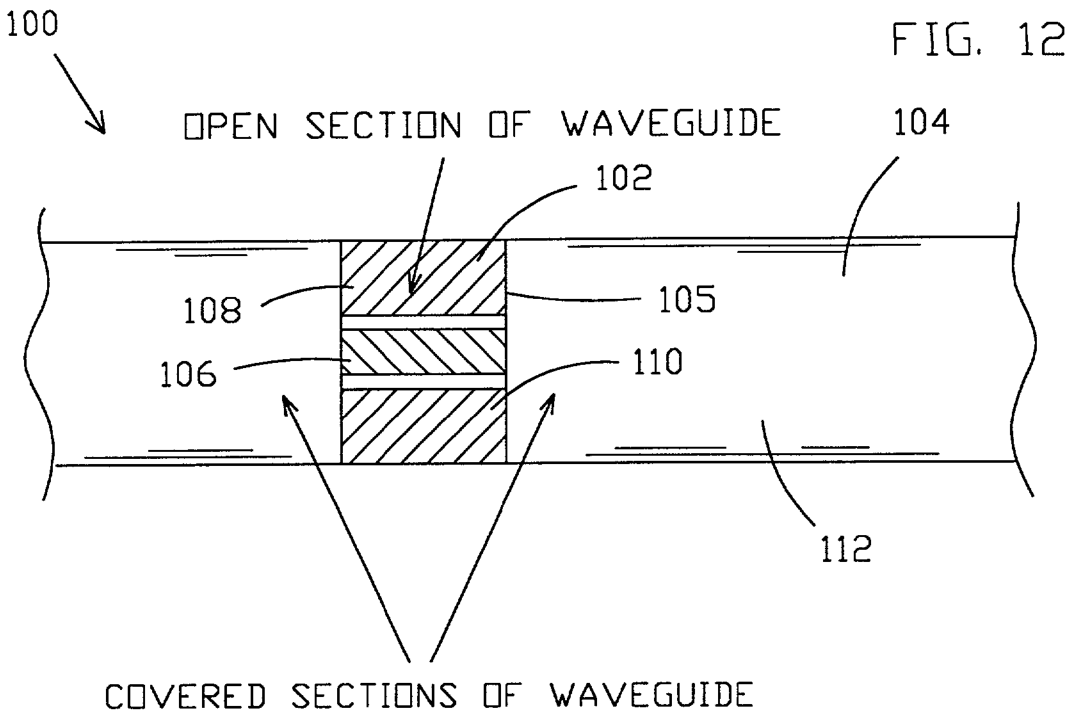
FIG. 12 is a top view, partially in section, of a waveguide showing a measurement cell and a non-measurement portion thereof.
Figure 13:
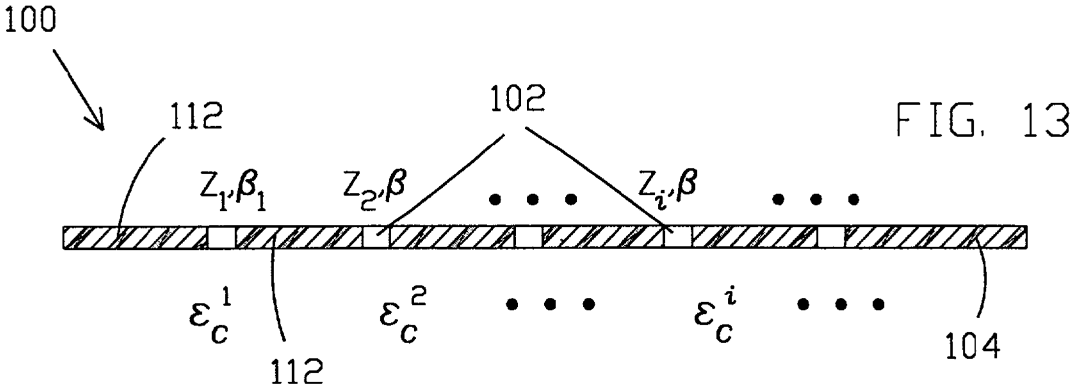
FIG. 13 is a schematic view of a transmission line sensor having therein a plurality of measurement cells that may be either physically separated or nonphysically separated.

In another embodiment of the invention, sensor 100 of FIG. 12 and FIG. 13 uses multiple measurement cells wherein each measurement cell is of the type discussed herein before. In this manner, the invention permits the detection of water turning to ice or ice turning to water over selected large surface areas, e.g., selected surfaces of an airplane wing. The device should be very effective in detecting ice forming on airplane wings. The sensor strips 100 can be made many feet in length, approximately one-half inch wide and very thin. Multiple sensor strips 100 can be used to cover the critical places on airplane wings or other surfaces of the aircraft. The electronics system 150 of FIG. 17 associated with sensor 100 is simple and inexpensive. Two quadrature outputs 152 are provided from which displays 156 are derived for viewing by the pilot, or software can be easily be written to interpret the data using computer 154 and activate an alarm. Multiple sensors can be constructed in the form of sensor 10 or sensor 10A or using other types of transmission line sensors.

Figure 15:
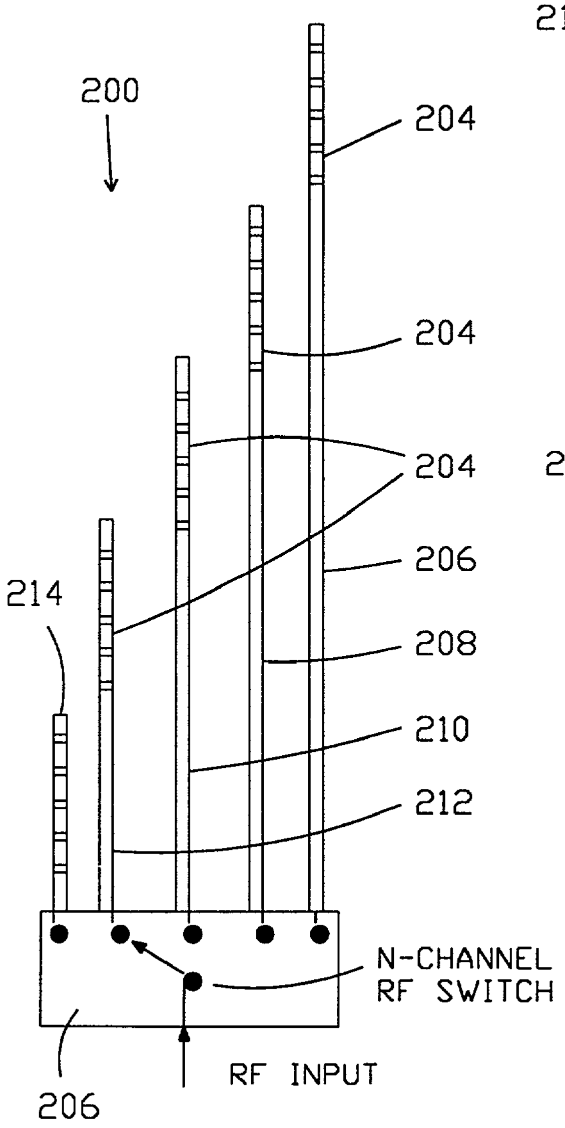
FIG. 15 is a schematic view of a plurality of transmission line sensors with staggered measurement cells with a multiplexor.
Figure 16:
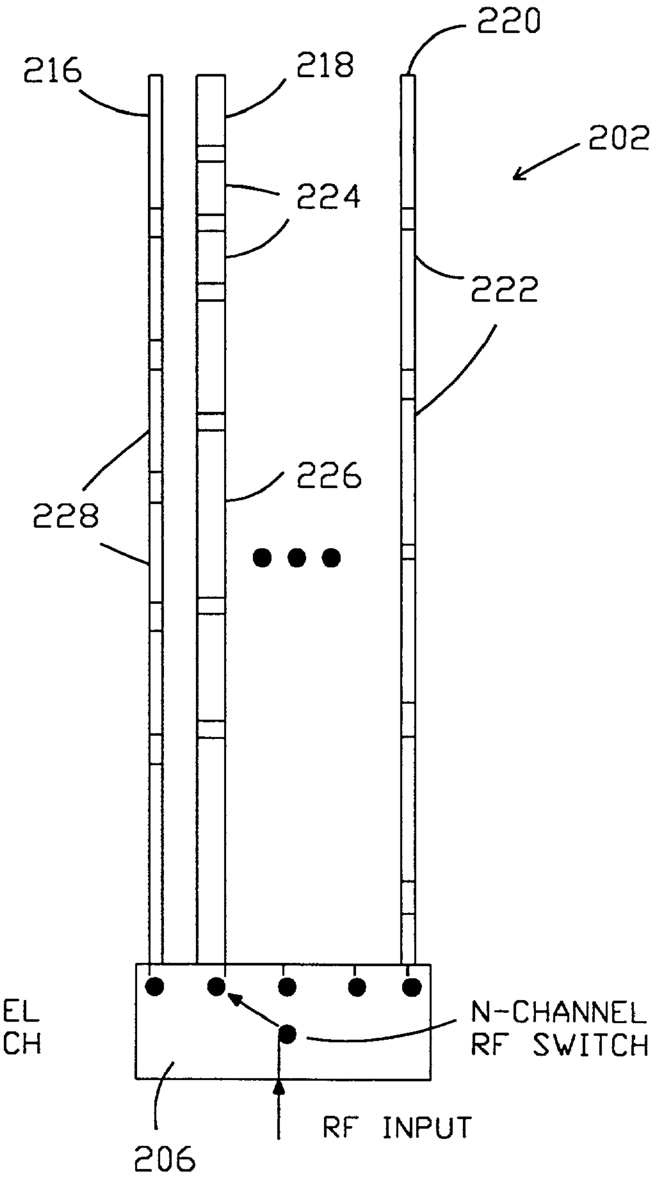
FIG. 16 is a schematic view of a plurality of transmission line sensors with measurement cells staggered in another way as compared to FIG. 15.

Sensor 100 is basically a microwave transmission line made from thin film material as discussed in connection with sensor 10 or sensor 10A. At a frequency of 1 GHz, sensing points or measurement cells 102 are approximately 4 inches apart. The sensing points or measurement cells 102 are preferably spaced one-half wavelength apart in transmission line 104 and placed at the open circuit points. In FIG. 12, openings 105 in the upper layer of the transmission line permit materials such as water or ice to reach center conductor 106 and outer conductors 108 and 110 of transmission line 104 or reach a microstrip conductor such as microstrip conductor 30 of FIG. 2. Liquid or other superstrates act as a parallel load on transmission line 104 at each point 102. If the water is present at only one point, it can easily be observed. Since the effect of one sensor point 102 cannot always be readily distinguished from another, multiple strips as shown in FIG. 15 and FIG. 16 could be used to localize the ice formation as discussed subsequently. Use of multiple transmission lines should present no problem since it is a simple matter to switch sequentially or by a directed choice among the strips using, for instance, a multiplexor such as multiplexor 206 discussed subsequently. With use of a multiplexor, only one set of associated electronics equipment is needed.

Figure 17:
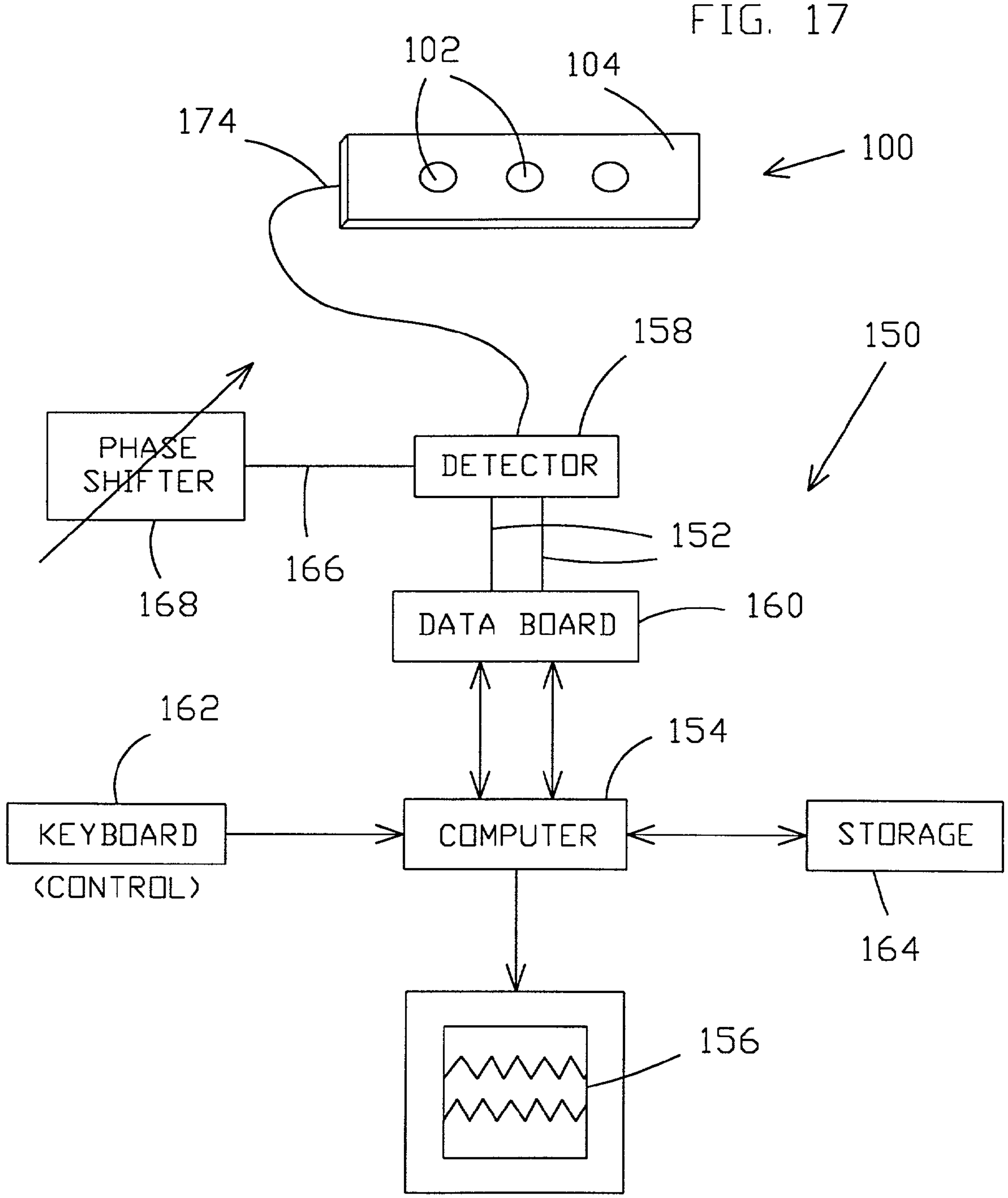
FIG. 17 is a schematic view of a phase detector for detecting phase and amplitude from a transmission line sensor.

The major components of a detection system in accord with the present invention are shown in FIG. 17. The signal from one or more measurement cells 102 in one or more transmission line sensors 100 are directed to phase detector 158. As shown in FIG. 15 and 16, multiple sensor strip systems 200 and 202 can be used with a single phase detector 158 by multiplexing between transmission line sensors with multiplexor 206. Alternatively, more than one phase detector could be used. System 150 of FIG. 17 measures the magnitude and phase of the signal from the sensor 100. Each sensor area or measurement cell 102 on transmission line or strip 104 acts in the same way as all the others. This is accomplished by spacing measurement cells 102 one-half wavelength apart as measured in the substrate material. A careful layout of the spacing will cause the amplitude and phase of the signal to phase detector 158 to keep shifting in the same direction as ice forms on each of sensor areas or measurement cells 102. In the testing of one embodiment of the invention, a frequency of 1 GHz was used. For this frequency, sensor spots or measurement cells 102 are located approximately 4 inches apart or a multiple thereof. Sensor transmission line or strip 104 may generally be long enough to contain from 1 to 12 sensors. The optimum frequency will differ depending largely on the desired length of sensing strip 104, the spacing between sensor spots 102, and the superstrates to be detected.

Phase shifter 168 may or may not be used to apply a reference signal 166 to phase detector 158. Phase detector analog outputs are applied to data acquisition board 160. The use of two channels, i.e., I and Q, allows the device to be selectively tuned in phase for optimal sensitivity for a visual display of a particular phenomenon.

Data acquisition board 160 is one of many boards that are available for plug-in to personal computers. Many channels can be provided at minimal cost. Analog-to-digital conversion rates are more than adequate for this application. Computer 154 requirements are not critical unless a large amount of processing is deemed desirable to assist pilots in their decision making. Viewdac software or other software may be used to provide graphs and the like such as the graph of FIG. 18. Keyboard 162 may be used to select different viewing or operational aspects, if desired, and storage 164 may be used to store program information, measurement data, as well as baseline information needed for analysis by computer 154.

The present invention also provides a computer simulation to assist in designing ice sensor 100 and supporting electronics 150. The computer simulation can be used to optimize the choice of frequency for a particular application, the number of measurement cells 102 per transmission line strip 104, the size of each measurement cell 102, and the design of substrate material such as R2 or R2A. Also the computer simulation can be used to predict results so that it is not always necessary to run a test. Computer simulation output is similar and verifiable to test results such as that shown in FIG. 18 for sensor output versus time wherein subsequent measurement cells show water turning to ice and the corresponding times. Curve 170 is the in-phase output and curve 172 is the quadrature output. These curves represent the I and Q outputs 152 of phase detector 158 of FIG. 17.

Inputs to the computer simulation of the present invention may include but are not limited to:

- Line Width
- Substrate thickness
- Substrate dielectric constant
- Operating frequency
- Measuring cell size
- Thickness of the medium accumulating at the measuring cell
- Existence of an intermediate measuring cell
- If an intermediate measuring cell exists, what medium is present
- Starting temperatures
- Rates of cooling or heating At sensing areas or measuring cells 102, a known superstrate 112 which covers part of microstrip transmission line 104 has been etched exposing conductors such as conductor 30 of the construction of FIG. 2 or center and/or outer conductors 106, 108, and 10 of the construction of FIG. 12 (see also FIG. 1). In these regions, electric field flux lines are exposed. Being exposed they can be influenced by the medium or superstrate through which they pass. For the ice detector application, this medium or superstrate will be air, water, ice, glycol, or a mixture thereof.

The impedance that is seen by phase detector 158 is that which appears at connector 174 of sensor strip 100. To determine the effect of a load on the measured signal, each load at each measurement cell 102 must be translated appropriately along transmission line 104. This is done by starting at the distal end with respect to connector 174 and translating the impedance back to the next measuring cell 102. At this point, the translated impedance becomes the new load impedance for the next measuring cell, and the process is repeated. The impedance as seen by phase detector 158 is therefore affected by all measuring cells 102 along sensor 100 and a global sensor is thereby achieved across the airplane wing or other surface.

In one embodiment, in order to maximize the number of cells that can be used in one strip 104 without significantly degrading the sensitivity of an cell, measuring cells 102 can be located at an integer multiple one-half wavelengths from each other and from connector 174.

The impedance loads at measurement cells 102 are dependent on several factors. These include the complex permittivity of the superstrate, the superstrate thickness, and the size of measurement cell 102. The measurement cell 102 size determines the number of flux lines to pass through the medium. The configuration of the flux lines, the substrate geometry and the complex permittivity of the substrate are also factors in determining the load impedance at each measurement cell 102.

Tests have been performed in a thermal chamber to ascertain the response of microwave ice sensor 100 under different operating conditions. These conditions include tests with water only, as well as tests with various water/glycol mixtures, as applied to measurement cells 102. The phase detector provided both I (in phase) and Q (quadrature) components outputs 152. It is possible to increase the sensitivity of these two components by adjusting the phase delay to the detector if desired. The thermal test chamber cooled at a rate of 40 degrees centigrade/minute which is much faster than occurs in an actual environment with the airplane waiting on the runway. The water turns to ice quite rapidly and adheres to the transmission line sensor 100. The tests show that the measurement cells 102 are not affected by the amount of water but rather the state (ice versus liquid) of the water. Additional water turning to ice on a particular measurement cell 102 does not affect sensor 100 output voltage. While glycol/mixtures on an airplane will have a slower transition rate, computer analysis and other features such as crossover points in I and Q can be utilized where desired.

Figure 18:
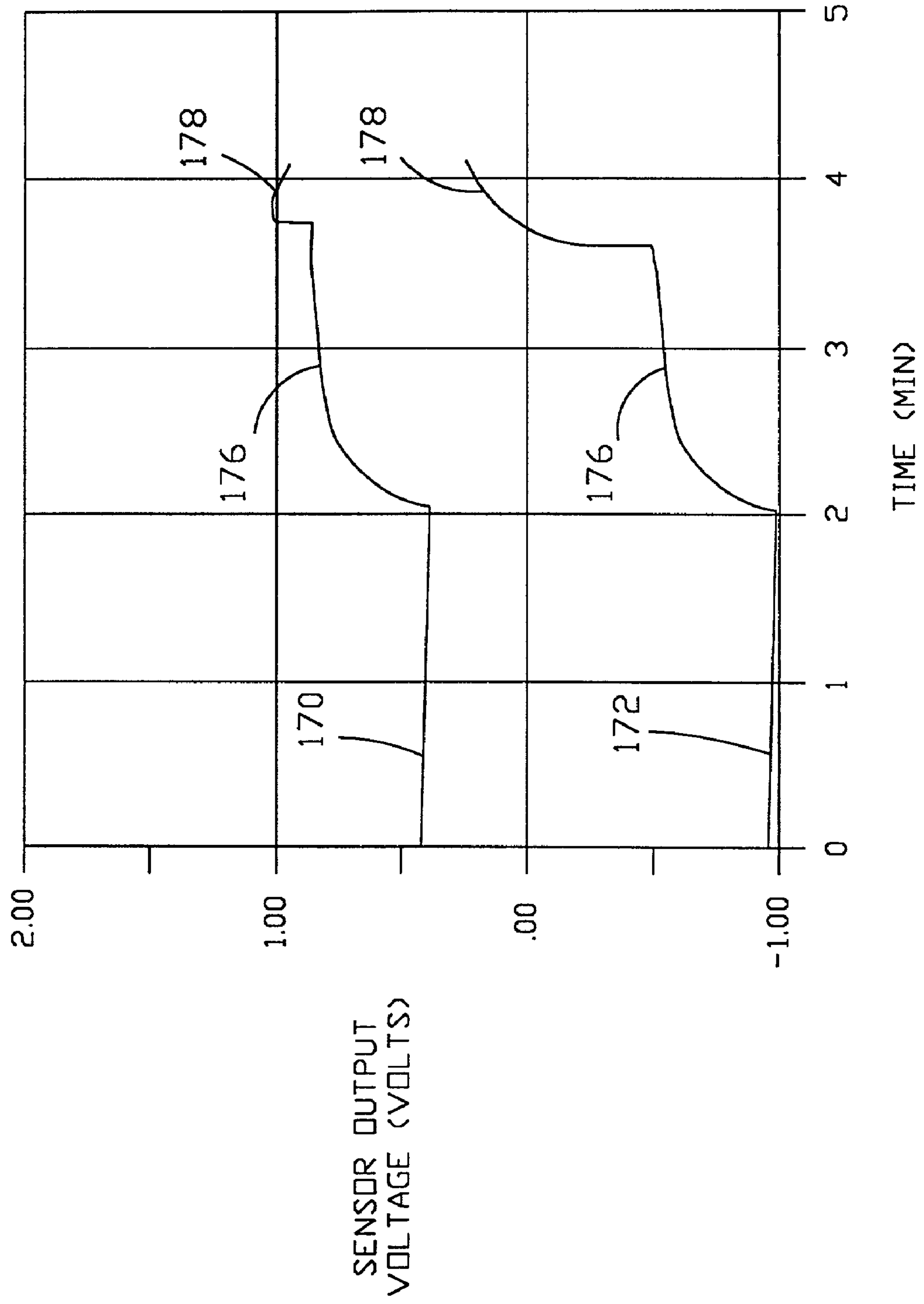
FIG. 18 is a graphical view of sensor output versus time that shows ice formation at different times on two different measurement cells.

For transmission line 104 with multiple measurement cells 102 at open-circuit points, it is also possible to see water to ice transitions at each measurement cell 102. Curves 170 and 172 of FIG. 18 show the effect of ice formation at a first measurement cell 102 at 176, then a second measurement cell 102 at 178. Additional measurement cell reactions could also be observed in the same way as desired. By calibrating the stripline sensor 100, it is possible to determine how many of the measurement cells 102 have ice adhering to the surface.

Therefore, it is possible to increase the effective area of accurate coverage as shown with sensor 100 by dividing a long section of transmission line 104 into measurement cells 102 as shown in FIG. 12 and FIG. 13. Measurement cells 102, as discussed above, are formed by open or uncovered sections of otherwise covered waveguide 104. In a preferred embodiment for an ice detector for an airplane wing, cover 112 consists of a dielectric material preferably having a conductive surface 112 on the top side. FIG. 12 shows the detail of a single measurement cell 102 and the adjacent covered or non-measurement sections 112. The waveguide type shown in FIG. 12 is a coplanar waveguide, as discussed hereinbefore, though the intent is merely to show the cell division. The technique of the present invention, with multiple cells alternating with covered sections, applies to all waveguide transmission lines although the coplanar waveguide construction and microstrip construction discussed herein are preferred embodiments.

The characteristic impedances of the individual measurement cells 102 are identical in the preferred embodiment, although this is not necessary. Likewise, the characteristic impedances of each covered non-measurement section 112 are identical to each other and to the characteristic impedance of measurement cells 102 in the preferred embodiment. In general, however, the impedances of measurement cells 102 and covered non-measurement sections 112 may all be selected to optimize sensitivity of the cells to particular contaminants (e.g. ice).

The technique of dividing sensor 100 into measurement cells 102 offers the advantage of reducing the sample area of the sensor while channeling energy to all measurement cells 102. In a decision algorithm of the present invention based on delta amplitude/phase values and discussed hereinafter, this feature is important to eliminate or reduce phase ambiguity. In the decision algorithm that is based on the so-called "inverse problem," as discussed hereinafter, this technique can be used to:

i. Define measurement cells 102 assumed to be of uniform superstrate material (e.g., all water or all ice), and ii. Define regions that can be further divided into sub-cells (or β-cells) of uniform superstrate material.

In an alternate embodiment, the covered non-measurement, or covered, sections 112 possess a length equivalent to one-half effective wavelength of the covered waveguide. This has the effect of removing the effects from the covered non-measurement sections 112 of waveguide transmission line 104. Both the coplanar waveguide and microstrip waveguide as discussed hereinbefore can be used either separately or in conjunction with each other to provide additional information.

One embodiment of the invention provides an inverse-problem method of reducing the phase and magnitude data retrieved from sensor 100 for any number of measurement cells 102 for determination of a superstrate material. Reduction of the raw data is required for the indication of the presence or absence of a certain material, or for the estimation of the material identity or material parameters on or near sensor 100.

In this method, waveguide 104 is considered divided into a number, N, of β-cells. In this section, β-cell divisions 102 will be discussed. β-cell divisions 102 may be supplied by the physically determined cell distribution as discussed hereinbefore, or they may be entirely abstract with the partitions existing only in the algorithm firmware, or the division may be a combination of physically divided cells with further β-cell partitioning in the algorithm firmware. However, it will be understood that this is another type of measurement cell 102 along waveguide 104 in accord with the present invention. Regardless of the nature of the division, the sensor may be considered to consist of N such β-cells with each β-cell possessing an unknown superstrate material (e.g., ice). Reference is made to FIG. 13 wherein $\epsilon_c^1, \epsilon_c^2, \ldots, \epsilon_c^1$ are the complex relative dielectric constants for each respective β-cell division 102, or $\beta_1, \beta_2, \ldots, \beta_i$, having respective impedances $Z_1, Z_2, \ldots, Z_i$.

In this method, the objective is to determine, in an optimal sense, the material parameters associated with each β-cell 102. These parameters will typically be the real and imaginary parts of the complex relative dielectric constant, $\epsilon_c^1 \equiv (\epsilon_r' + j\epsilon_r'')^1$, where the superscript "i" denotes the dielectric of the $i^{th}$ β-cell. The imaginary part will be considered general so as to include the conductivity of the material. It is assumed that the characteristic impedance and propagation constants of the waveguide section, when covered with material i of complex relative dielectric constant, $\epsilon_c^1$, are known apriori, or can be estimated, or can be computed real time.

Given that the characteristic impedance, $Z_i$, and propagation constants, $\beta_i$, for arbitrary values of $\epsilon_c^1$, are available to the firmware algorithm for each β-cell, the phase and amplitude of the transmitted and reflected signals, referred to as the forward solution, may be readily computed in closed form. Let the forward solution be denoted by the complex vector $s_j(\epsilon_j)$, where the argument $\epsilon_j$ is a length-N vector with $i^{th}$ component equal to the $j^{th}$ estimate of the complex dielectric constant, $\epsilon_c^1$. In general, the forward solution vector will be of length $4^*N_f$, where $N_f$ is the number of frequencies, and the number 4 reflects the number of complex scattering parameters, or S-parameters, for a 2-port system. For a 1-port system, the forward solution vector will be of length $N_f$.

Associated with the forward solution $s(\epsilon)$ is an observable vector, $o(\epsilon)$. The latter vector is the set of S-parameters measured for each frequency, and is thus of length $4^*N_f$ for the 2-port or length $N_f$ for the 1-port system. The length-N vector $\epsilon$ is the actual, unknown, complex permittivity for the N β-cells.

The error vector in the forward solution after j iterations is given by:

$$\delta_j = s(\epsilon) - 0(\epsilon)$$

A suitable norm for the error vector can be defined:

$$f(\delta) = \|\delta\|_{Norm}$$

This function is referred to as the objective function. Minimization of the objective function can be accomplished with a global optimization algorithm. The optimization algorithm selects new estimates, $\epsilon_j$, at each iteration. Several criteria may be used to decide the acceptability of the final value of the objective function. Ideally, when f(δ) goes to zero, $\Delta\epsilon$ also goes to zero, although this is not necessary since the inverse problem is not unique. Therefore, it will usually be necessary to perform some check on the final estimate, $\epsilon_{final}$. Alternatively, the optimization algorithm may also be chosen to provide constraints on the allowable estimates, $\epsilon_j$. Depending on the application, the final estimate may be further reduced to indicate the presence or absence of a given material. For example, in the application of ice detection for aircraft wings, the proximity of any component of the vector, $\epsilon_{final}$, to the complex permittivity of ice, would be used to indicate the presence of ice.

Some additional variations of this method include:

i. Constraining the domain of the permittivity estimates, $\epsilon_c^1$, to discrete values. In this case, the optimization algorithm would try permutations of the set of allowable values.

ii. Once a suitable solution is established, the optimization algorithm may be changed from a global optimization algorithm to a local, gradient-based optimization algorithm starting at the last known solution. This assumes that the vector of actual values, $\epsilon$, is changing slowly relative to the estimate updates. This variation has the advantage of providing faster solutions.

If the variation listed under (ii) is implemented, an unacceptable estimate offered by the local optimizer can be handled by cycling through a set of replacement values, $\epsilon_{replace}$, that are predefined and associated with known, potential scenarios of an abrupt nature. For example, in the application of ice detection on aircraft wings, $\epsilon_j$ may be set to indicate an air superstrate after a strong wind event.

The rate of change of the observable vector, $\epsilon_j$, can be compared to the known rate of change for a particular transition, for example, the rapid transition from water to ice. This information can be incorporated into the optimization algorithm as a penalty function.

In addition to reflection measurements (S11 and S22), the phase and amplitude of the forward measurement (S12 and S21) may also be measured. The forward measurement provides additional information on the superstrate material parameters for each cell. For example, in the application of the ice sensor, the amplitude of the forward measurement is a function of the energy lost to the superstrate material. While this loss is high for a superstrate of water, the loss is much less for ice. In this embodiment, a final section of waveguide 104 may re-trace the length traversed by the preceding part of the sensor. The final section is, in a presently preferred embodiment, covered so as to be a non-measurement section and serves to place the second port of the sensor adjacent to the first port. One advantage of the use of β-cells is that the spacing thereof along the transmission line may be changed by changing the frequency of operation. This property may be of value in determining a particular location of the measurement cell.

In summary of the use of multiple measurement cells 102 in a waveguide structure that may be of coplanar waveguide construction or microstrip waveguide construction or other waveguide construction, three different methods have been used:

1) Cell division in which the sensor is physically divided into active measurement cells (uncovered) and non-active or non-measurement cells (covered sections);

2) β-cell division in which the sensor is considered by the firmware (i.e., non-physically) to be divided into cells that are used in the inverse problem of determination of the superstrate material on each cell; and 3) The cell divisions created physically by method (1) are further divided by the firmware into β-cells for use in the inverse problem determination of the superstrate material on each cell.

These cell-division methods allow extension of line 102 in order to cover more surface area with fewer ambiguities as might occur on a single length of line 102 wherein the entire length constitutes the measuring cell due to the problem of partial coverage by ice. Dividing the sensor transmission line into covered non-measurement cells and uncovered measurement cells provides sensitivity to all uncovered measurement cells.

In another embodiment of the present invention, a porous substrate such as substrate R2 or R2A is used. Alternatively, measurement cells that are recessed with respect to other surfaces such as the airplane wing may be used. For instance, substrate R2 or R2A of the waveguide 104 can be made porous to absorb liquid materials coming into contact with the surface of the sensor. This feature offers a couple of advantages/disadvantages for specific situations:

i. The sensitivity of the sensor is increased since the electric field within the substrate is now exposed to a change in material parameters.

ii. The foreign material within the substrate is shielded from external conditions, such as wind, that may otherwise confuse the sensor by rapidly removing the foreign material from the surface.

iii. It should be noted that one disadvantage of this alternate embodiment is the possibility of the sensor retaining a foreign material (e.g. glycol) that no longer exists on the surface being monitored (e.g. aircraft wing).

In another embodiment of the invention, a porous superstrate cover is placed on top of the sensor cells that are open for coverage by a superstrate in the preferred embodiment. In other words, R3 or R1A is a partially known porous superstrate. Foreign materials that are liquids will permeate the porous material and will affect the phase and amplitude measurements to a greater degree than non-liquid contaminants. The degree of the difference of the effects will depend on the thickness of the porous superstrate, on the type of waveguide, e.g., coplanar or microstrip, and on the design characteristics of the respective waveguide 104. As an example, if a porous superstrate is placed on top of a coplanar waveguide sensor such as that indicated by the construction shown in FIG. 1, solid foreign materials on top of porous superstrate R3 will have little effect on the S-parameter measurements. A liquid foreign material capable of permeating the porous material would likely have a great effect on the S-parameter measurements. If the same porous superstrate is placed on top of a microstrip sensor such as that indicated by the construction shown in FIG. 2, solid materials on top of porous superstrate R1 would have a more significant effect than occurred with the same solid foreign material on top of porous superstrate R3 with a coplanar waveguide construction. The degree of difference between the two waveguide types depends on the particular designs of the microstrip and coplanar waveguide sensors.

Figure 14:
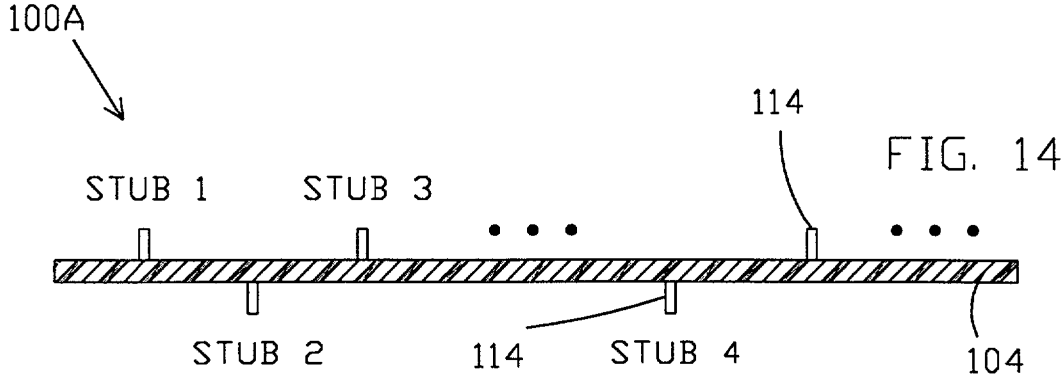
FIG. 14 is a schematic view of a transmission line with a plurality of stubs extending laterally therefrom.

In another embodiment as indicated in FIG. 14, a microstrip waveguide with stubs 114 may be utilized. For instance, a covered microstrip waveguide 104, extends the desired length of the sensor. Microstrip T-junctions 114 labeled stub 1, stub 2, etc., are placed along the length of waveguide. The junctions, segments, or stubs 114, may extend perpendicular to waveguide and may be uncovered and thus exposed to foreign superstrates. In this case, stubs 114 become the active part of the sensor since contaminants on the stubs alter the discontinuity presented at the main line. The spacing between the stubs, and the length of the stubs, can be designed to optimize detection of the desired superstrate material. This alternate embodiment can be realized in the frequency-or time-domain. Alternatively, covered microstrip stubs 114, can be placed along waveguide 104, such as a microstrip waveguide. In this embodiment, covered stubs 114 impose intentional discontinuities, or markers along line 104. These discontinuities can be placed to aid in the determination of the unknown foreign material on the sensor. In the time-domain, these discontinuities serve as time markers, and aid in associating measured discontinuities with specific cell locations.

In the presently preferred embodiment, the system of the present invention utilizes multiple frequencies. The selection of the set or band of frequencies can be chosen to improve discrimination of the foreign materials. For example, one of the frequencies may be chosen to exist at a known absorption line of one of the expected foreign materials, while another may be chosen to exist at a transmission window of the expected foreign material. It should be noted that use of multiple frequencies is inherent to the time domain embodiment described subsequently.

In this embodiment, the excitation of sensor 100 is a band or discrete set of frequencies. The time domain response is obtained by the fast-Fourier transform of the frequency response. Both reflection and transmission time domain measurements are preferably used to determine the foreign superstrate material. In one preferred embodiment, the absorption and transmission bands of the possible superstrate materials (e.g., glycol) are used to determine the operational frequencies. In some cases, it may be desirable to use low frequency or even DC current. For instance, DC current imposed on waveguide 104, such as that of coplanar construction as shown in FIG. 1, results in a resistance reading of material in the gaps, such as gaps 20 and 22, related to the resolution of glycol concentration. As well, intermediate power dividers with a high dielectric constant may be used in non-measurement cells 112 to reduce ambiguity as to which measurement cells 102 produced a certain reading.

In another embodiment such as sensor 200 as indicated in FIG. 15 and FIG. 16, preferably parallel waveguide sensors such as 206, 208, 210, 212, and 214 are utilized each of which may be located preferably in parallel across the airplane wing. As per the embodiment of FIG. 15, if ice is only formed on part of the wing along the length of the wing, then the particular part of the wing along its length may be determined by looking at the results of respective staggered measurement cells 204 on the respective lines. To a certain extent, the relative position along the width of the airplane wing will also be determined as the lines are spaced along the width of the airplane wing and run up and down the length of the wing. As noted previously, multiplexing allows use of numerous different waveguides each having a plurality of measurement cells 204 thereon. FIG. 16 provides another sensor 202 that illustrates a principle involved in determining especially where along the width of the wing ice may be formed. Thus, ice may be on line 216 but not 218 or 220 thereby determining the position of the ice. Non-measurement cells may be equal in length such as that shown by non-measurement cells 228 or 222 or varied such as that shown by non-measurement cells 224 or 226. Both techniques provide a way of staggered spacing that varies between lines 216 through 220 to give an indication of where along the length of the wing ice may be located. Markers such as high dielectric or stub markers could be used to further pinpoint the location of the ice as discussed hereinbefore. Note that combinations of these designs could also be used for providing more precise location of the ice on the airplane wing.

It is expected that there may be a practical upper limit to the number of measurement cells that can be added while maintaining adequate sensitivity to all of the cells. This also applies to the previously discussed inverse-problem method of determining the superstrate material. If this upper limit is insufficient to cover the region of interest, parallel lines can be used to extend the region as shown in FIG. 15 and FIG. 16. As shown in FIG. 15, line 212 is covered up to the end point of line 214, the third line 204 is covered up to the end of the second, line 212, and so on. The lengths of the lines do not necessarily have to be in any particular sequence. As shown in FIG. 16, the active cells of a line may be staggered compared to adjacent lines to increase the region of coverage. Also, the width of the respective conductors can be chosen very small, limited only by the minimal spacing to avoid crosstalk, or very large to maximize the width of the covered region.

Although the present invention is not limited to the waveguide construction indicated in FIGS. 1 and 2, some considerations for selecting between these two types of waveguides include the following:

1) The coplanar waveguide construction of FIG. 1 is a surface transmission line that is balanced relative to the ground plane when the gaps between center conductor 12 and outer conductors 14 and 16 are equal in width. This renders the transmission properties of the coplanar waveguide construction less susceptible to nearby conducting materials than transmission lines that are not balanced relative to the ground plane.
2) The balanced ground plane configuration reduces the likelihood of the sensor inducing electromagnetic interference (EMI) or radio frequency interference (RFI) in neighboring electronic systems (e.g., aircraft avionics)
3) Quasi-static approximations for the characteristic impedance and propagation constant of the coplanar waveguide are readily available.
4) Feed transitions between a coplanar waveguide construction and other types of transmission lines are fairly straightforward.
5) The CPW can be designed so that the electric field intensity falls off rapidly in the direction normal to the surface. This is advantageous in sensor applications in which it is desirable for the sensor to be very sensitive to the immediate superstrate, but insensitive to additional layers above the immediate superstrate.

The first and last of these reasons have been found to be significant advantages. Number (1) above is important for the sensor application as it is likely that the sensor will be placed in close proximity to metallic components not intended as part of the transmission line. In the ice detection application, for example, the base of the substrate base will likely consist of an electrodeposited or rolled metallic film or of the metallic wing of the aircraft itself. Coupling of the electric field with the metallic base of the substrate will reduce the sensitivity of a surface transmission line sensor. Increasing the substrate thickness reduces the coupling to the metallic base of the substrate. In the application of detecting ice on aircraft wings, however, a limit on the substrate thickness is imposed by airflow perturbations due to the sensor. The balanced ground configuration of the coplanar waveguide construction results in a greater sensitivity when the substrate thickness is fixed, or permit a thinner substrate when the sensitivity is equal to that provided by a surface transmission line without a balanced ground configuration. Furthermore, for the embodiment in which part of the transmission line is covered, the top of the cover may also be metallic. This metallic cover would be in close proximity to both the open transmission line adjacent to the covered sections and to the CPW section that is covered.

Number (2) above is important since the use of a wide band of frequencies heightens the ability of the sensor to discern between the various superstrate materials. The wider band, however, also creates the need to suppress associated EMI and RFI.

In one embodiment of the present invention, the active part of the sensor is a microstrip line such as the microstrip construction shown in FIG. 2. Although the microstrip sensor with or without multiple measurement cells 102 has been found to be less sensitive to the superstrate material and that additional superstrate layers may render identification of the first superstrate difficult, the microstrip construction as shown in FIG. 2 has also been found to have some advantages which are listed below:

1) As discussed above, the microstrip construction sensor may be used to determine the thickness of the ice. The coplanar waveguide construction sensor is more limited in determination of ice thickness beyond a few thousandths of an inch so long as the gaps are narrow for the reasons discussed above.
2) Microstrip stubs can be more easily added as described hereinbefore.
3) Parallel microwave sensors as described above are perhaps easier to incorporate.

Thus, while the preferred embodiment of the superstrate detection apparatus and methods are disclosed in accord with the law requiring disclosure of the presently preferred embodiment of the invention, other embodiments of the disclosed concepts may also be used. Therefore, the foregoing disclosure and description of the invention are illustrative and explanatory thereof, and various changes in the method steps and also the details of the apparatus may be made within the scope of the appended claims without departing from the spirit of the invention.

What is claimed is:

1. An instrument for detecting one or more superstrates, comprising:

a transmission line;

a substrate mounted on an opposite side of said transmission line from said one or more superstrates;

a plurality of measurement cells formed within said transmission line, wherein at least one of said plurality of measurement cells is integrally formed within said transmission line;

a microwave source for applying a microwave signal to said transmission line and each of said plurality of measurement cells formed within said transmission line; and a detector for detecting said one or more superstrates with respect to said plurality of measurement cells;

wherein said at least one of said plurality of measurement cells must necessarily be present for continuity of said transmission line and for transmission of said microwave signal during operation of said instrument, and wherein said instrument is not based on the condition of resonance.

2. The instrument of claim 1, wherein said transmission line further comprises a coplanar waveguide with a center conductor mounted between two outer conductors.

3. The instrument of claim 2, wherein said center conductor is mounted so as to define first and second spaces between said center conductor and each of said two outer conductors, said first and second spaces each having a width smaller than about one hundredth of an inch.

4. The instrument of claim 3, wherein said first and second spaces are equal in width.

5. The instrument of claim 3, wherein said center conductor is mounted so as to define first and second spaces between said center conductor and each of said two outer conductors, said first and second spaces each having a width such that an electric field is affected by said one or more superstrates having a thickness of less than two millimeters.

6. The instrument of claim 1, wherein said substrate has a thickness of less than one tenth inch.

7. The instrument of claim 1, wherein said substrate has a dielectric constant less than five.

8. The instrument of claim 1, further comprising a coaxial cable connected to said transmission line with a gold ribbon connection.

9. The instrument of claim 1, further comprising:

each of said plurality of measurement cells being spaced apart along said transmission line with respect to each other with a spacing that is an integer multiple of one-half wavelength.

10. The instrument of claim 1, further comprising:

a known superstrate for covering a plurality of non-measurement portions of said transmission line not including said measurement cells.

11. The instrument of claim 10, wherein each of said plurality of non-measurement portions of said transmission line have a length equal to an effective wavelength of said microwave signal divided by two.

12. The instrument of claim 1, further comprising a plurality of non-measurement portions of said transmission line, at least a portion of said measurement cells being physically partitioned from said plurality of non-measurement portions of said transmission line.

13. The instrument of claim 1, further comprising a plurality of non-measurement portions of said transmission line, at least a portion of said measurement cells being non-physically partitioned from said plurality of non-measurement portions of said transmission line.

14. The instrument of claim 1, further comprising:

a plurality of transmission lines, a plurality of measurement cells formed on each of said plurality of transmission lines, and a mulitplexor for switching between said plurality of transmission lines.

15. The instrument of claim 1, wherein at least one of said one or more superstrates is formed of a porous material.

16. The instrument of claim 1, wherein at least a portion of said substrate is formed of a porous material.

17. The instrument of claim 1, wherein said transmission line is uniform along its length without discontinuities.

18. The instrument of claim 1, further comprising:

a plurality of discontinuities formed within said transmission line.

19. The instrument of claim 18, wherein said plurality of discontinuities further comprise a plurality of stubs extending from said transmission line.

20. The instrument of claim 19, wherein said plurality of stubs form said plurality of measurement cells.

21. The instrument of claim 19, wherein said plurality of stubs form markers between said plurality of measurement cells.

22. The instrument of claim 18, wherein said plurality of discontinuities further comprises a plurality of power dividers.

23. The instrument of claim 1, further comprising:

a second transmission line, said second transmission line being configured to produce a detected signal more sensitive to a thickness of said one or more superstrates than said first transmission line.

24. The instrument of claim 1, wherein said transmission line is configured to provide a signal to said detector that is substantially unaffected by a thickness of said one or more superstrates.

25. A waveguide sensor for detecting one or more superstrates, comprising:

a center conductor;

two outer conductors mounted such that said center conductor is disposed between said two outer conductors such that a respective spacing is formed on either side said center conductor separating said center conductor from said two outer conductors, each said respective spacing being selected for controlling a measurement depth of said superstrate, said center conductor and said two outer conductors being oriented parallel with respect to each other; and a substrate mounted on an opposite side of said waveguide sensor from said superstrate, wherein said waveguide sensor is not based on the condition of resonance for detecting said one or more superstrates.

26. The waveguide sensor of claim 25, wherein each of said respective spacings are less than one-hundreth of an inch.

27. The waveguide sensor of claim 25, wherein each of said respective spacings are selected for detecting a superstrate less than two millimeters thick.

28. The waveguide sensor of claim 25, wherein said substrate has a dielectric constant less than about five.

29. The waveguide sensor of claim 25, wherein said substrate has a thickness less than about one-tenth of an inch.

30. The waveguide sensor of claim 25, wherein at least a portion of said substrate is porous.

31. The waveguide sensor of claim 25, further comprising:

a plurality of measurement cells formed integral with said center conductor and said two outer conductors.

32. The waveguide sensor of claim 31, further comprising:

a plurality of non-measurement portions formed integral with said center conductor and said two outer conductors, at least a portion of said plurality of measurement cells being physically partitioned from said plurality of non-measurement portions.

33. The waveguide sensor of claim 31, further comprising:

a plurality of non-measurement portions formed integral with said center conductor and said two outer conductors, at least a portion of said measurement cells being non-physically partitioned from said plurality of non-measurement portions.

34. The waveguide sensor of claim 31, further comprising:

a plurality of non-measurement portions formed integral with said center conductor and said two outer conductors, a microwave source for applying a microwave signal to each of said plurality of measurement cells, said non-measurement portions having a length of a wavelength of said microwave signal divided by two, and a known superstrate covering said center conductor for said plurality of non-measurement portions.

35. The waveguide sensor of claim 25, wherein each said respective spacing is equal to each other, each said respective spacing being open to permit air, liquids, or solids to fill said space.

36. The waveguide sensor of claim 25, further comprising:

a second waveguide for determining a thickness of said superstrate, said second waveguide having a single elongate conductive strip, a conductive ground plane, and a second substrate separating said elongate conductive strip and said conductive ground plane.

37. A waveguide sensor for detecting one or more superstrates, comprising:

a single elongate conductive strip;

a conductive ground plane;

a substrate mounted on an opposite side of said one or more superstrates, said substrate separating said single elongate conductive strip and said conductive ground plane;

a detector being operable for measuring a phase angle associated with energy applied to said transmission line and utilizing said phase angle for at least one of either determining a thickness of said one or more superstrates or for distinguishing between predetermined superstrates; and a plurality of measurement cells disposed along said single conductive strip.

38. The waveguide sensor of claim 37, further comprising:

a plurality of non-measurement portions disposed along said single conductive strip, at least a portion of said measurement cells being physically partitioned from said plurality of non-measurement portions.

39. The waveguide sensor of claim 37, further comprising:

a plurality of non-measurement portions disposed along said elongate conductive strip, at least a portion of said measurement cells being non-physically partitioned from said plurality of non-measurement portions, said at least a portion of said measurement cells necessarily being present to permit an electromagnetic wave to travel through said transmission line.

40. The waveguide sensor of claim 37, further comprising:

a plurality of non-measurement portions disposed along said single conductive strip, a microwave source for applying a microwave signal to each of said plurality of measurement cells, at least a portion of said non-measurement portions having a length of a wavelength of said microwave signal divided by two, and a known superstrate covering said plurality of non-measurement portions.

41. A method of detecting one or more superstrates on a transmission line, comprising:

providing a plurality of measurement cells integrally formed within said transmission line wherein at least one of said plurality of measurement cells must necessarily be present for continuity of said transmission line;

applying a signal to said transmission line such that said signal is applied to through each of said measurement cells; and measuring an output signal from said transmission line for said detection of said one or more superstrates, wherein said at least one of said plurality of measurement cells must be necessarily present for application of said signal to said transmission line when detecting said one or more superstrates on said transmission line, and wherein said method is not based on the condition of resonance.

42. The method of claim 41, further comprising:

measuring a phase of said output signal.

43. The method of claim 41, further comprising:

measuring a phase and amplitude of said output signal.

44. The method of claim 41, further comprising:

providing a plurality of transmission lines wherein each of said plurality of transmission lines contains a plurality of measurement cells.

45. The method of claim 44, further comprising:

providing a mulitiplexor to separately sample a respective output signal from each of said plurality of transmission lines.

46. The method of claim 44, further comprising:

utilizing said plurality of transmission lines to determine a position of said one or more superstrates.

47. The method of claim 46, further comprising:

positioning said plurality of measurement cells on each of said plurality of transmission lines to enhance said determining of said position of said one or more superstrates.

48. The method of claim 47, further comprising:

staggering a first of said plurality of measurement cells on a first of said plurality of transmission lines with respect to a second of said plurality of measurement cells on a second of said plurality of transmission lines.

49. The method of claim 46, further comprising:

providing different lengths for said plurality of transmission lines.

50. The method of claim 41, further comprising:

utilizing a single frequency of operation for said detection of said one or more superstrates.

51. The method of claim 44, further comprising:

utilizing a first transmission line for detecting a presence of one or more superstrates, and utilizing a second transmission line for detecting a thickness of said one or more superstrates when said presence is detected.

52. The method of claim 41, further comprising:

collecting data with a data acquisition board.

53. The method of claim 41, wherein said signal is a microwave signal.

* * * * *